United States Patent
Yang et al.

(10) Patent No.: US 10,861,745 B2
(45) Date of Patent: Dec. 8, 2020

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Chan Syun David Yang, Taipei (TW); Li-Te Lin, Hsinchu (TW); Chun-Jui Huang, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/898,719

(22) Filed: Feb. 19, 2018

(65) Prior Publication Data

US 2019/0164829 A1 May 30, 2019

Related U.S. Application Data

(60) Provisional application No. 62/593,054, filed on Nov. 30, 2017.

(51) Int. Cl.
| | | |
|---|---|---|
| *H01L 21/768* | (2006.01) | |
| *H01L 29/66* | (2006.01) | |
| *H01L 23/535* | (2006.01) | |
| *H01L 29/78* | (2006.01) | |

(Continued)

(52) U.S. Cl.
CPC ...... *H01L 21/76897* (2013.01); *H01L 23/535* (2013.01); *H01L 29/41791* (2013.01); *H01L 29/66795* (2013.01); *H01L 29/785* (2013.01); *H01L 29/7851* (2013.01); *H01L 29/165* (2013.01); *H01L 29/66545* (2013.01); *H01L 29/7848* (2013.01)

(58) Field of Classification Search
CPC ............. H01L 29/7311; H01L 29/0895; H01L 21/76877; H01L 21/76897; H01L 21/76883; H01L 29/41791; H01L 29/66795; H01L 29/785; H01L 29/7851; H01L 21/823828; H01L 21/82385; H01L 21/823864; H01L 21/823871

See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |

(Continued)

FOREIGN PATENT DOCUMENTS

| | | |
|---|---|---|
| KR | 20160059862 A | 5/2016 |
| KR | 20170065421 A | 6/2017 |

*Primary Examiner* — Sue A Purvis
*Assistant Examiner* — Scott Stowe
(74) *Attorney, Agent, or Firm* — Slater Matsil, LLP

(57) ABSTRACT

A semiconductor device such as a fin field effect transistor and its method of manufacture are provided. In some embodiments gate spacers are formed over a semiconductor fin, and a first gate stack is formed over the fin. A first sacrificial material with a large selectivity to the gate spacers is formed over the gate stack, and a second sacrificial material with a large selectivity is formed over a source/drain contact plug. Etching processes are utilized to form openings through the first sacrificial material and through the second sacrificial material, and the openings are filled with a conductive material.

20 Claims, 18 Drawing Sheets

(51) Int. Cl.
    *H01L 29/417*     (2006.01)
    *H01L 29/165*     (2006.01)

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2003/0049920 A1 | 3/2003 | Koyama |
| 2015/0287827 A1* | 10/2015 | Leobandung ..... H01L 29/66795 257/288 |
| 2016/0013104 A1* | 1/2016 | Hung ................ H01L 29/41791 257/288 |
| 2016/0141417 A1 | 5/2016 | Park et al. |
| 2017/0162581 A1 | 6/2017 | Lai et al. |
| 2017/0170293 A1 | 6/2017 | Zang |
| 2017/0186849 A1 | 6/2017 | Chen et al. |
| 2017/0194211 A1 | 7/2017 | Lai et al. |
| 2017/0278747 A1 | 9/2017 | Adusumilli et al. |
| 2019/0198394 A1* | 6/2019 | Basker .............. H01L 21/76897 |

\* cited by examiner

US 10,861,745 B2

SEMICONDUCTOR DEVICE AND METHOD OF MANUFACTURE

PRIORITY CLAIM AND CROSS-REFERENCE

This application claims priority to and the benefit of U.S. Provisional Application No. 62/593,054, filed on Nov. 30, 2017, entitled "Semiconductor Device and Method of Manufacture," which application is hereby incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
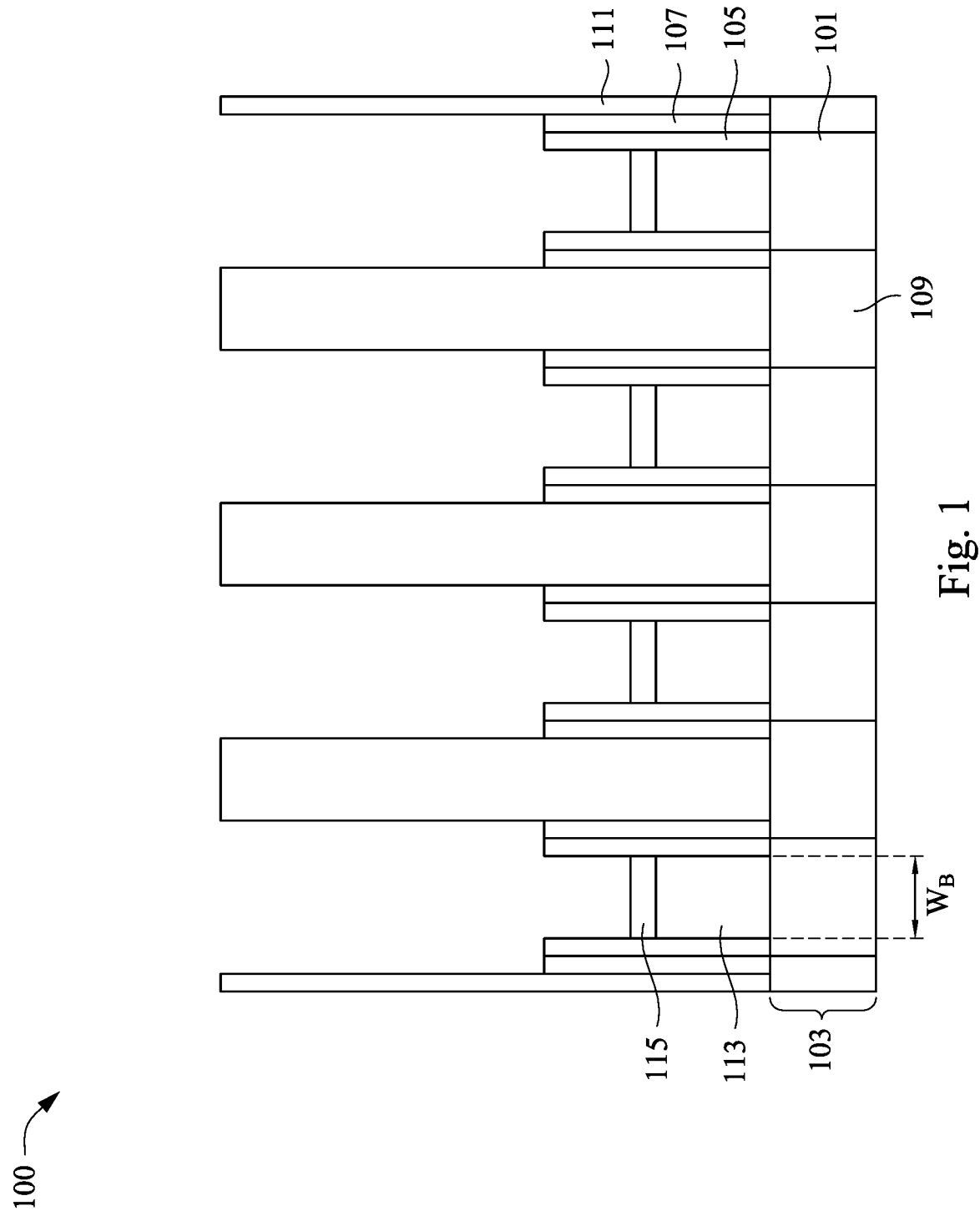
FIG. 1 illustrates a formation of gate stack in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment in which self-aligned contact materials are utilized within a three nanometer process node. However, the ideas presented herein can be utilized in a wide variety of embodiments, and are not intended to be limited to the embodiments described herein.

With respect now to FIG. 1, there is illustrated a cross-sectional view of a semiconductor device 100 such as a finFET device. In an embodiment the semiconductor device 100 comprises a substrate 101, which may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

First trenches may be formed as an initial step in the eventual formation of first isolation regions (not separately illustrated in the view of FIG. 1). The first trenches may be formed using a masking layer along with a suitable etching process. Once the masking layer has been formed and patterned, the first trenches are formed in the substrate 101. The exposed substrate 101 may be removed through a suitable process such as reactive ion etching (RIE) in order to form the first trenches in the substrate 101, although any suitable process may be used. In an embodiment, the first trenches may be formed to have a first depth of less than about 5,000 Å from the surface of the substrate 101, such as about 2,500 Å.

In addition to forming the first trenches, the masking and etching process additionally forms fins 103 from those portions of the substrate 101 that remain unremoved. These fins 103 may be used, as discussed below, to form the channel region of multiple-gate FinFET transistors. While FIG. 1 only illustrates one fin 103 formed from the substrate 101, any number of fins 103 may be utilized.

Once the first trenches and the fins 103 have been formed, the first trenches may be filled with a dielectric material and the dielectric material may be recessed within the first trenches to form the first isolation regions. The dielectric material may be an oxide material, a high-density plasma (HDP) oxide, or the like. The dielectric material may be formed, after an optional cleaning and lining of the first trenches, using either a chemical vapor deposition (CVD) method (e.g., the HARP process), a high density plasma CVD method, or other suitable method of formation as is known in the art.

The first trenches may be filled by overfilling the first trenches and the substrate 101 with the dielectric material and then removing the excess material outside of the first trenches and the fins 103 through a suitable process such as chemical mechanical polishing (CMP), an etch, a combination of these, or the like. In an embodiment, the removal process removes any dielectric material that is located over the fins 103 as well, so that the removal of the dielectric material will expose the surface of the fins 103 to further processing steps.

Once the first trenches have been filled with the dielectric material, the dielectric material may then be recessed away from the surface of the fins 103. The recessing may be performed to expose at least a portion of the sidewalls of the fins 103 adjacent to the top surface of the fins 103. The dielectric material may be recessed using a wet etch by dipping the top surface of the fins 103 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 103 of between about 50 Å and about 500 Å, such as about 400 Å. Additionally, the recessing may also remove any leftover dielectric material located over the fins 103 to ensure that the fins 103 are exposed for further processing.

After the first isolation regions have been formed, a dummy gate dielectric, a dummy gate electrode 117 (not illustrated in FIG. 1 but a remaining one of which is illustrated in a separate cross-section below with respect to FIG. 3B) over the dummy gate dielectric (both of which are not illustrated in FIG. 1 due to further processing), and first spacers 105 may be formed over each of the fins 103. In an embodiment the dummy gate dielectric may be formed by thermal oxidation, chemical vapor deposition, sputtering, or any other methods known and used in the art for forming a gate dielectric. Depending on the technique of gate dielectric formation, the dummy gate dielectric thickness on the top of the fins 103 may be different from the gate dielectric thickness on the sidewall of the fins 103.

The dummy gate dielectric may comprise a material such as silicon dioxide or silicon oxynitride with a thickness ranging from about 3 angstroms to about 100 angstroms, such as about 10 angstroms. The dummy gate dielectric may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric.

The dummy gate electrode 117 may comprise a conductive material and may be selected from a group comprising of polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrode 117 may be deposited by chemical vapor deposition (CVD), sputter deposition, or other techniques known and used in the art for depositing conductive materials. The thickness of the dummy gate electrode 117 may be in the range of about 5 Å to about 200 Å. The top surface of the dummy gate electrode 117 may have a non-planar top surface, and may be planarized prior to patterning of the dummy gate electrode 117 or gate etch. Ions may or may not be introduced into the dummy gate electrode 117 at this point. Ions may be introduced, for example, by ion implantation techniques.

Once formed, the dummy gate dielectric and the dummy gate electrode 117 may be patterned to form a series of stacks over the fins 103. The stacks define multiple channel regions located on each side of the fins 103 beneath the dummy gate dielectric. The stacks may be formed by depositing and patterning a gate mask (not separately illustrated in FIG. 1) on the dummy gate electrode 117 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 117 and the dummy gate dielectric may be etched using a dry etching process to form the patterned stacks.

Once the stacks have been patterned, the first spacers 105 may be formed. The first spacers 105 may be formed on opposing sides of the stacks. The first spacers 105 are typically formed by blanket depositing a spacer layer (not separately illustrated in FIG. 1) on the previously formed structure. The spacer layer may comprise SiN, oxynitride, SiC, SiON, SiOCN, SiOC, oxide, SiOCN (KN1), SiOCN (RP1), SiOCN (RP2), SiOC (HA2), SiOC (HA3), with different component percentages and with different curing temperature and porosity, and the like.

The first spacers 105 may be deposited using a deposition process such as plasma enhanced atomic layer deposition (PEALD), thermal atomic layer deposition (thermal ALD), plasma enhanced chemical vapor deposition (PECVD), and formation may be followed by a curing process. Additionally, during the deposition process the process temperature can be held to be between about 250° C. and about 400° C. However, any suitable deposition and process conditions may be utilized. The first spacers 105 may then be patterned, such as by one or more etches to remove the spacer layer from the horizontal surfaces of the structure, to form the first spacers 105.

Additionally, while the first spacers 105 are described above as being made of a single material with a constant composition, this is intended to be illustrative and is not intended to be limiting to the embodiments. Rather, any suitable composition of the materials of the first spacers 105 or variations within the materials of the first spacers 105 (e.g., variations of silicon, carbon, oxygen, and nitrogen percentages) may be utilized. Similarly, any suitable variation of cure temperatures may also be utilized.

Once the first spacers 105 have been formed, second spacers 107 may be formed adjacent to the first spacers 105. In an embodiment the second spacers 107 may be formed on opposing sides of the first spacers 105. The second spacers 107 are typically formed by blanket depositing a second spacer layer on the previously formed structure. The second spacer layer may comprise a material similar to, but different from, the first spacers 105, such as by being SiN, oxynitride, SiC, SiON, SiOCN, SiOC, oxide, KN1, RP1, RP2, HA2, HA3, with different component percentages and with different curing temperature and porosity, and may be formed in a similar manner as the first spacers 105. The second spacers 107 may then be patterned, such as by one or more etches to remove the second spacer layer from the horizontal surfaces of the structure, to form the second spacers 107.

Once the second spacers 107 have been formed, portions of the fins 103 not protected by the dummy gate dielectric, the dummy gate electrode 117, the first spacers 105, and the second spacers 107 are removed and source/drain regions 109 are regrown. The removal of the fins 103 from those areas not protected by the dummy gate dielectric, the dummy gate electrode 117, the first spacers 105 and the second spacers 107 may be performed by a reactive ion etch (RIE) using the stacks and the first spacers 105 as hardmasks, or by any other suitable removal process.

Once these portions of the fins 103 have been removed, a hard mask (not separately illustrated), is placed and patterned to cover the dummy gate electrode 117 to prevent growth and the source/drain regions 109 may be regrown in contact with each of the fins 103. In an embodiment the source/drain regions 109 may be regrown and, in some embodiments the source/drain regions 109 may be regrown to form a stressor that will impart a stress to the channel regions of the fins 103 located underneath the stacks. In an embodiment wherein the fins 103 comprise silicon and the FinFET is a p-type device, the source/drain regions 109 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

Once the source/drain regions 109 are formed, dopants may be implanted into the source/drain regions 109 by implanting appropriate dopants to complement the dopants in the fins 103. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks and the first spacers 105 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point the hard mask that covered the dummy gate electrode 117 during the formation of the source/drain regions 109 is removed. In an embodiment the hard mask may be removed using, e.g., a wet or dry etching process that is selective to the material of the hard mask. However, any suitable removal process may be utilized.

Once the source/drain regions 109 have been formed, a first inter-layer dielectric (ILD) layer 111 is formed over the stacks and the source/drain regions 109. The first ILD layer 111 may comprise a material such as boron phosphorous silicate glass (BPSG), although any suitable dielectrics may be used. The first ILD layer 111 may be formed using a process such as PECVD, although other processes, such as LPCVD, may alternatively be used. The first ILD layer 111 may be formed to a thickness of between about 100 Å and about 3,000 Å. Once formed, the first ILD layer 111 may be patterned using, e.g., a masking and etching process in order to expose the material of the dummy gate electrode 117.

Once the first ILD 111 is formed, a removal and replacement of the material of the dummy gate electrode 117 and the dummy gate dielectric is performed. In an embodiment the dummy gate electrode 117 and the dummy gate dielectric may be removed using, e.g., a wet or dry etching process that utilizes etchants that are selective to the material of the dummy gate electrode 117 and the dummy gate dielectric, but which may, in some embodiments, also remove a portion of the first spacers 105 and the second spacers 107 such that the first spacers 105 and the second spacers 107 are below the surface of the first ILD 111. However, any suitable removal process may be utilized.

After the first ILD layer 111 is formed, a plurality of layers for a gate stack (collectively labeled as gate stack 113 in FIG. 1) are deposited in their stead, including a first dielectric material, a first conductive layer, a first metal material, a work function layer, and a first barrier layer. In an embodiment the first dielectric material is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material may be deposited to a thickness of between about 5 Å and about 200 Å, although any suitable material and thickness may be utilized.

Optionally, an interfacial layer may be formed prior to the formation of the first dielectric material. In an embodiment the interfacial layer may be a material such as silicon dioxide formed through a process such as in situ steam generation (ISSG). However, any suitable material or process of formation may be utilized.

The first conductive layer may be a metal silicide material such as titanium silicon nitride (TSN). In an embodiment the first conductive layer may be formed using a deposition process such as chemical vapor deposition, although any suitable method of deposition, such as a deposition and subsequent silicidation, may be utilized to a thickness of between about 5 Å and about 30 Å. However, any suitable thickness may be utilized.

The first metal material may be formed adjacent to the first dielectric material as a barrier layer and may be formed from a metallic material such as TaN, Ti, TiAlN, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material may be deposited using a deposition process such as atomic layer deposition, chemical vapor deposition, sputtering, or the like, to a thickness of between about 5 Å and about 200 Å, although any suitable deposition process or thickness may be used.

The work function layer is formed over the first metal material, and the material for the work function layer may be chosen based upon the type of device desired. Exemplary p-type work function metals that may be included include Al, TiAlC, TiN, TaN, Ru, Mo, WN, $ZrSi_2$, $MoSi_2$, $TaSi_2$, $NiSi_2$, WN, other suitable p-type work function materials, or combinations thereof. Exemplary n-type work function metals that may be included include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a desired threshold voltage Vt is achieved in the device that is to be formed in the respective region. The work function layer(s) may be deposited by CVD, PVD, and/or other suitable process to a thickness of between about 5 Å and about 50 Å.

The first barrier layer may be formed adjacent to the work function layer and, in a particular embodiment, may be similar to the first metal material. For example, the first barrier layer may be formed from a metallic material such as TiN, Ti, TiAlN, TaC, TaCN, TaSiN, Mn, Zr, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the first barrier layer may be deposited using a deposition process such as atomic layer deposition, chemical vapor deposition, sputtering, or the like, to a thickness of between about 5 Å and about 200 Å, although any suitable deposition process or thickness may be used.

The metal layer may be a material that is both suitable for use as a seed layer to help a subsequent filling process as well as a material that can be used to help block or reduce the transport of fluorine atoms into the work function layer. In a particular embodiment, the metal layer may be crystalline tungsten (W) that is formed free from the presence of fluorine atoms using, e.g., an atomic layer deposition process, although any suitable deposition process may be utilized. The metal layer may be formed to a thickness of between about 20 Å and about 50 Å, such as between about 30 Å and about 40 Å.

Once the metal layer has been formed, a fill material is deposited to fill a remainder of the opening. In an embodiment the fill material may be a material such as Al, Cu, AlCu, W, Ti, TiAlN, TaC, TaCN, TaSiN, Mn, Zr, TiN, Ta, TaN, Co, Ni, combinations of these, or the like, to a thickness of between about 1000 Å and about 2000 Å, such as about 1500 Å. However, any suitable material may be utilized.

FIG. 1 additionally illustrates that, after the fill material has been deposited to fill and overfill the opening, the materials of the first dielectric material, first conductive layer, first metal material, work function layer, first barrier layer, metal layer, and fill material may be planarized to form a gate stack 113. In an embodiment the materials may be planarized with the first ILD 111 using, e.g., a chemical mechanical polishing process, although any suitable process, such as grinding or etching, may be utilized. Additionally, after the planarization the gate stack 113 may have a bottom width $W_B$ of between about 10 nm and about 13 nm, such as about 11 nm, although any suitable dimensions may be utilized.

After the materials of the gate stack 113 have been formed and planarized, the materials of the gate stack 113 may optionally be recessed and capped with a capping layer 115. In an embodiment the materials of the gate stack 113 may be recessed using, e.g., a wet or dry etching process that utilizes etchants selective to the materials of the gate stack 113. In an embodiment the materials of the gate stack 113 may be recessed a distance of between about 5 nm and about 150 nm, such as about 120 nm. However, any suitable process and distance may be utilized.

Once the materials of the gate stack 113 have been recessed, the capping layer 115 is deposited in order to act as an etch stop layer for subsequent processing (described further below). In an embodiment the capping layer 115 is a material such as tungsten (W) or ruthenium formed using, e.g., an atomic layer deposition process which will selectively grow on the material of the gate stack 113 without forming on other exposed surfaces. The capping layer 115 may be formed to a thickness of between about 4 nm and about 8 nm, such as about 6 nm. However, any suitable material, process of formation, and thickness may be utilized.

Figure 2:
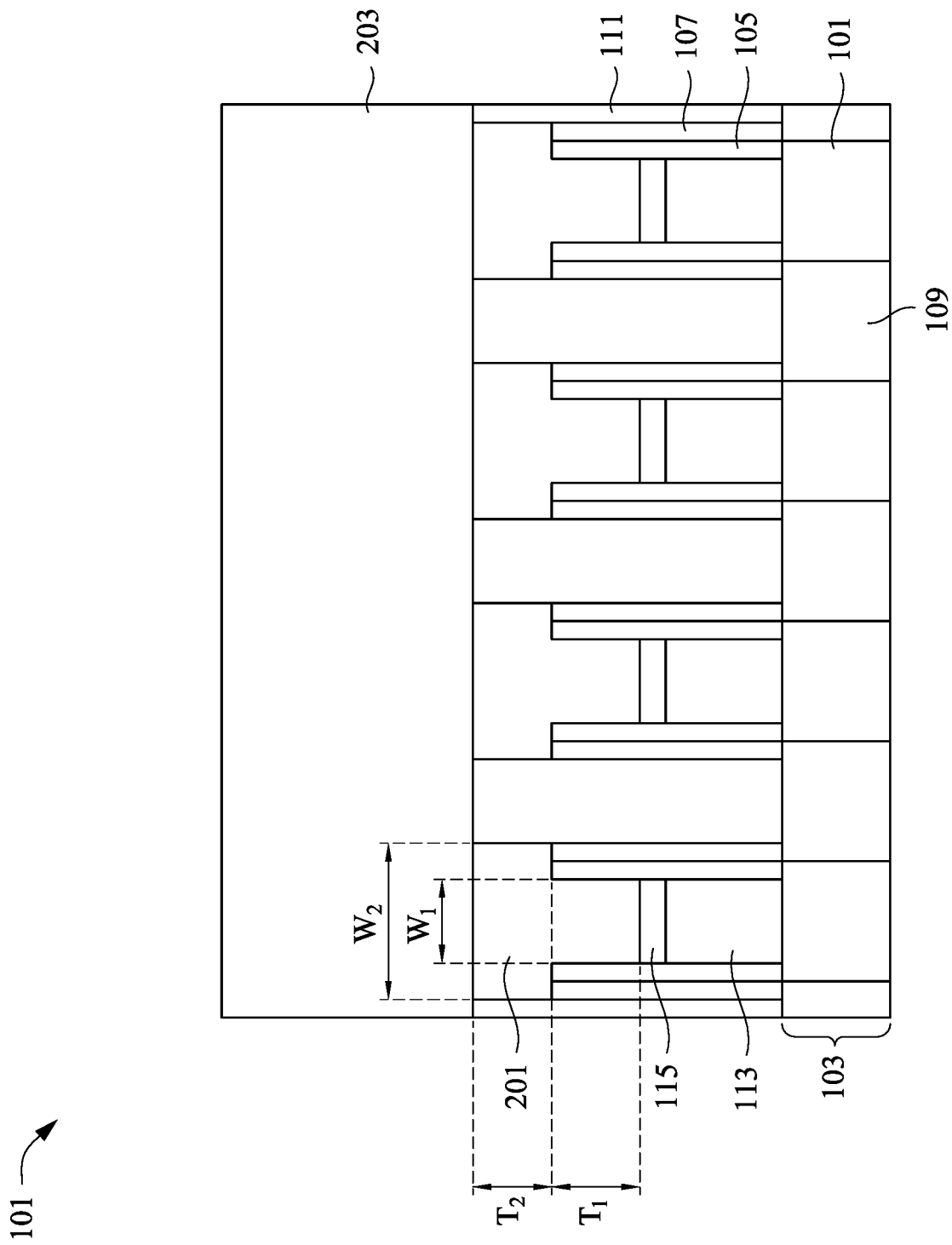
FIG. 2 illustrates a formation of a first sacrificial material in accordance with some embodiments.

FIG. 2 illustrates a deposition of a first sacrificial material 201 over the capping layer 115. In an embodiment the first sacrificial material 201 is a material that may be used as a hard mask material with a high etch selectivity to a second sacrificial material 801 (not illustrated in FIG. 2 but illustrated and described below with respect to FIG. 8), the materials of the gate stack 113, the capping layer 115, a first contact material 601, the first spacers 105 (e.g., oxides such as silicon oxide) and the second spacer 107 (e.g., nitrides such as silicon nitride) without requiring another etch stop layer and with little residual material. For example, the first sacrificial material 201 may have an etch selectivity to either the first spacers 105 or the second spacers 107 of between about 9 and about 35, such as greater than about 9, such as greater than about 12, greater than about 27, or greater than about 35. Additionally, the first sacrificial material 201 may also have an etch selectivity to the second sacrificial material 801 of between about 12 and about 40, such as greater than about 12, such as greater than about 20 or greater than about 40.

Additionally, in some embodiments the first sacrificial material 201 may also be a dielectric material with good chemical mechanical polishing properties that helps to increase the integration flexibility in advanced technology nodes. In a particular embodiment the first sacrificial material 201 may be a material such as zirconium oxide (ZrO), although other suitable materials, such as silicon oxide ($SiO_2$), silicon nitride (SiN), aluminum oxide (AlO), silicon oxycarbide (SiOC), silicon carbon (SiC), zirconium nitride (ZrN), combinations of these, or the like, may also be utilized. The first sacrificial material 201 may be deposited using a deposition process such as plasma enhanced atomic layer deposition (PEALD), thermal atomic layer deposition (thermal ALD), plasma enhanced chemical vapor deposition (PECVD), wherein the process temperature can be held to be between about 250° C. and about 400° C. However, any suitable deposition process and process conditions may be utilized.

Bu using such materials, the height of the gate may be protected while still helping to reduce or prevent etch loss or damage from occurring during subsequent etching processes (discussed further below). Additionally, by utilizing these materials, a high oxide etch selectivity on small CD and high aspect ratio oxide etches may be achieved. Also, in embodiments which utilize a second sacrificial material 801, these materials provide high etch selectivity during subsequent etching of the second sacrificial material 801, while still providing a wide etch process window.

Once the first sacrificial material 201 has been deposited, the first sacrificial material 201 may be planarized to remove excess material. In an embodiment the first sacrificial material 201 may be planarized using, e.g., a chemical mechanical polishing process, whereby etchants and abrasives are utilized along with a rotating platen in order to react and remove the excess material of the first sacrificial material 201. However, any suitable planarization process may be utilized to planarize the first sacrificial material 201 and the first ILD layer 111.

By planarizing the first sacrificial material 201 with the first ILD layer 111, the first sacrificial material 201 is formed to have two portions: a first portion located within the first spacers 105 and a second portion located outside of the first spacers 105 within the first ILD layer 111. Additionally, while the first portion and the second portion are illustrated in FIG. 2 as being separated from each other by a dashed line, this is done for clarity, as there may or may not be a discernible interface between the first portion and the second portion of the first sacrificial material 201. In an embodiment the first portion has a first width $W_1$ of between about 12 nm and about 15 nm, such as about 12 nm, and has a first thickness $T_1$ of between about 20 nm and about 30 nm, such as about 22 nm. Additionally, the second portion has a second width $W_2$ of between about 20 nm and about 28 nm, such as about 22 nm, and a second thickness $T_2$ of between about 14 nm and about 26 nm, such as about 16 nm. However, any suitable dimensions may be utilized.

FIG. 2 also illustrates a formation of a second ILD layer 203 over the gate stacks 113 and the source/drain regions 109. The second ILD layer 203 may comprise a material such as boron phosphorous silicate glass (BPSG), although any suitable dielectrics may be used. The second ILD layer 203 may be formed using a process such as PECVD, although other processes, such as LPCVD, may alternatively be used. The second ILD layer 203 may be formed to a thickness of between about 100 Å and about 3,000 Å. Once formed, the second ILD layer 203 may be planarized using, e.g., a planarization process such as chemical mechanical polishing process, although any suitable process may be utilized.

Figure 3A:
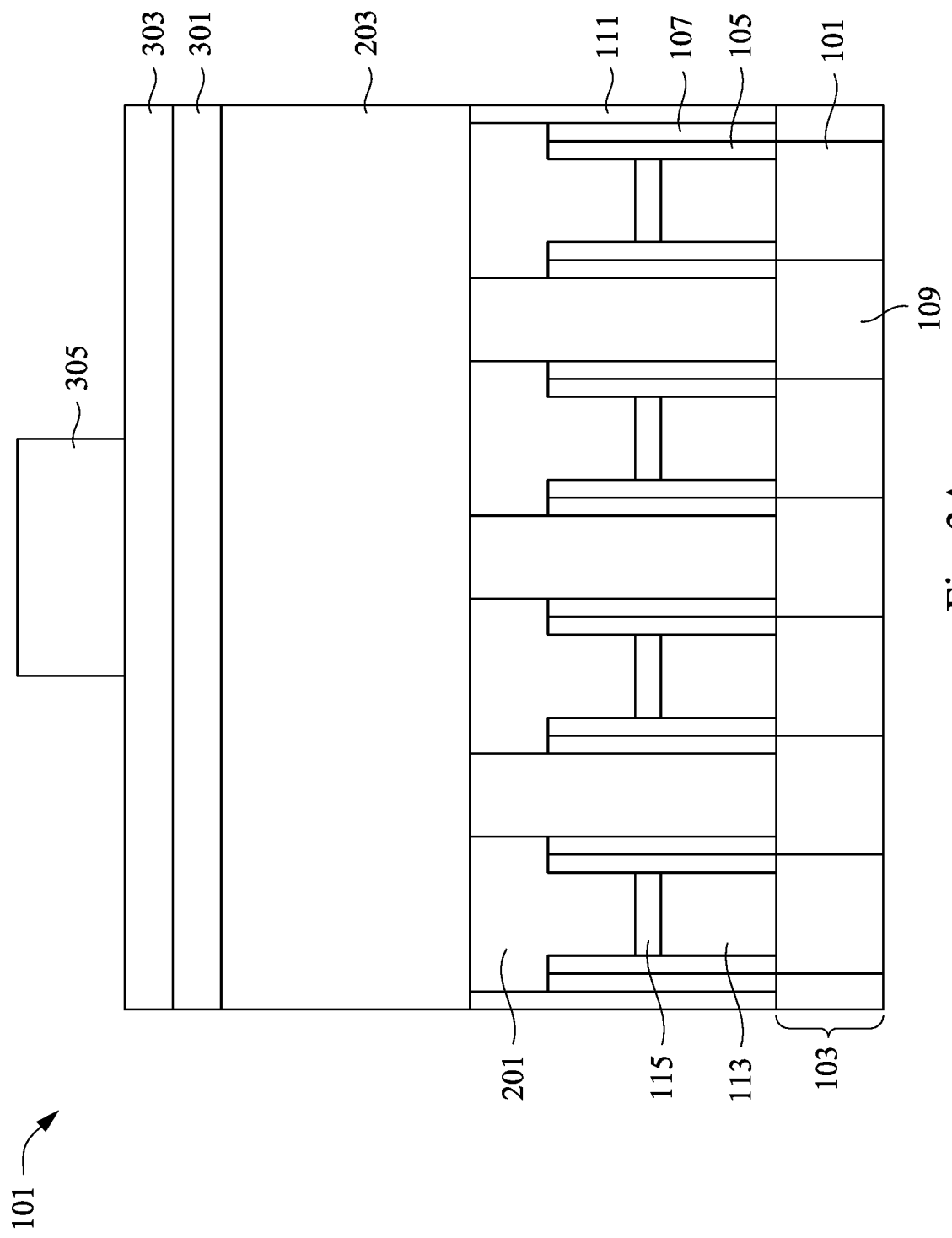
FIGS. 3A-3B illustrate a formation of layers for a contact end cut in accordance with some embodiments.

FIG. 3A illustrates a formation of layers for a contact end cut (CMD). In a particular embodiment, a first CMD layer 301, a second CMD layer 303, and a third CMD layer 305 are formed over the second ILD layer 203. In accordance with some embodiments the first CMD layer 301 is a metal hard mask layer, which may be formed of titanium nitride, for example. The first CMD layer 301 may have a thickness in the range between about 200Å and about 400Å. The second CMD layer 303 may be a Low-Temperature (LT) oxide layer, which is deposited at a low temperature, for example, lower than about 100° C. The second CMD layer 303 may include silicon oxide, for example. The second CMD layer 303 may have a thickness in the range between about 300Å and about 600Å. The third CMD layer 305 is deposited over the second CMD layer 303, and may have a thickness between about 100Å and about 300Å. The third CMD layer 305 may be an amorphous silicon layer. The third CMD layer 305, however, may be formed of other materials. Each of the first CMD layer 301, the second CMD layer 303, and the third CMD layer 305 may be formed using Chemical Vapor Deposition (CVD), Atomic Layer Deposition (ALD), or the like.

Once the first CMD layer 301, the second CMD layer 303, and the third CMD layer 305 have been formed, the first CMD layer 301, the second CMD layer 303, and the third CMD layer 305 are patterned. In an embodiment the first CMD layer 301, the second CMD layer 303, and the third CMD layer 305 are pattered using, e.g., a photolithographic masking and etching process, whereby a single or tri-layer photoresist is applied and exposed to a patterned energy source (e.g., light) in order to induce a chemical reaction. After exposure, a developer is applied in order to remove either the exposed or unexposed portions to form a patterned photoresist. The pattern of the photoresist may then be transferred to the underlying third CMD layer 305 using, e.g., one or more etching processes such as reactive ion etching processes. However, any suitable etching processes may be utilized.

Figure 3B:
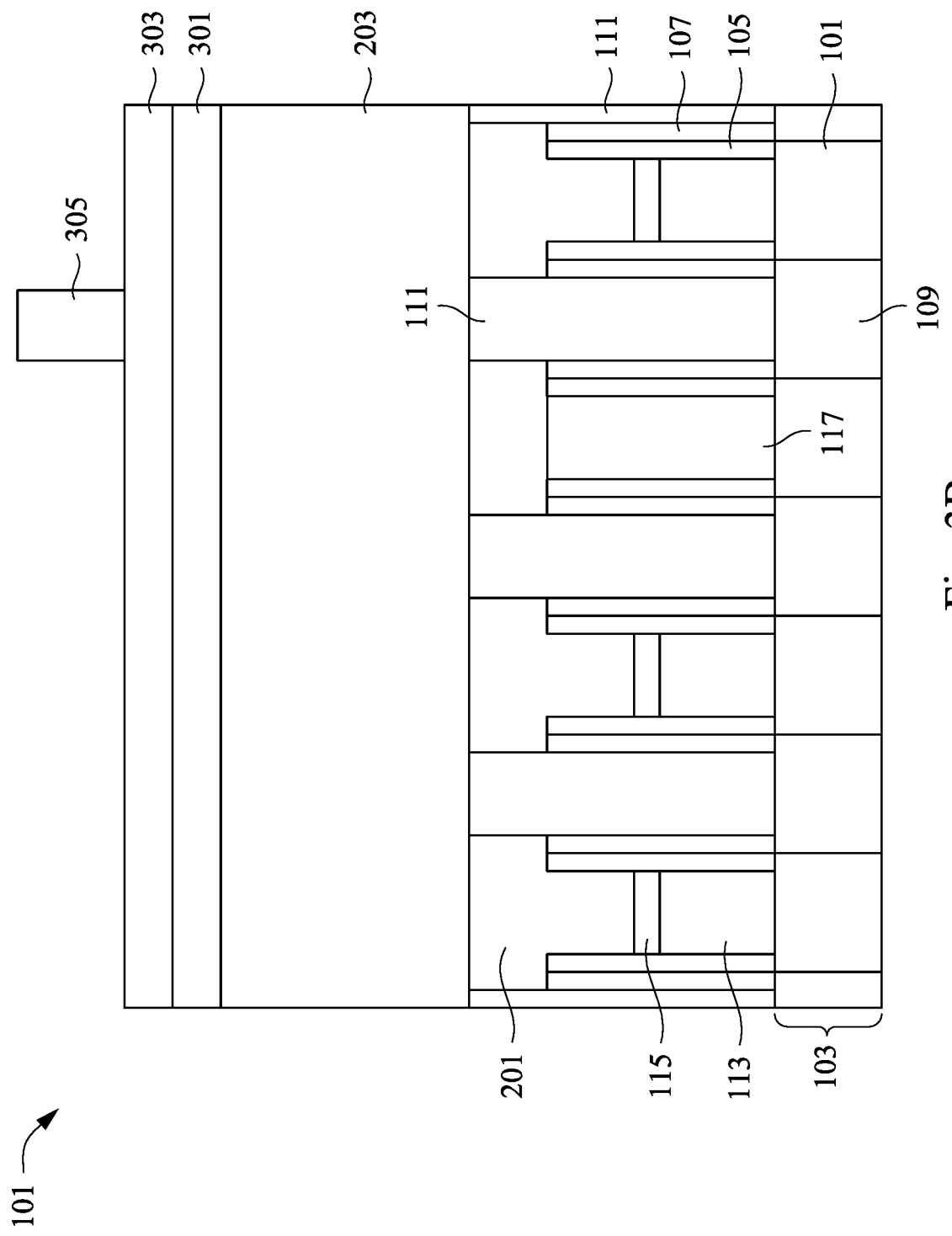

FIG. 3B illustrates a separate cross-sectional view of the view illustrated in FIG. 3A, in which the third CMD layer 305 is positioned to protect the first ILD layer 111 within one region between two gate stacks 113. Such protection is intended to keep the material of the first ILD layer 111 within this region as the material of the first ILD layer 111 is removed and replaced in other regions, as described further below with respect to FIGS. 4-8. FIG. 3B additionally illustrates that some of the dummy gate electrodes 117 are not fully removed (as described above with respect to FIG. 1), and may be retained in subsequent process steps.

Figure 4:
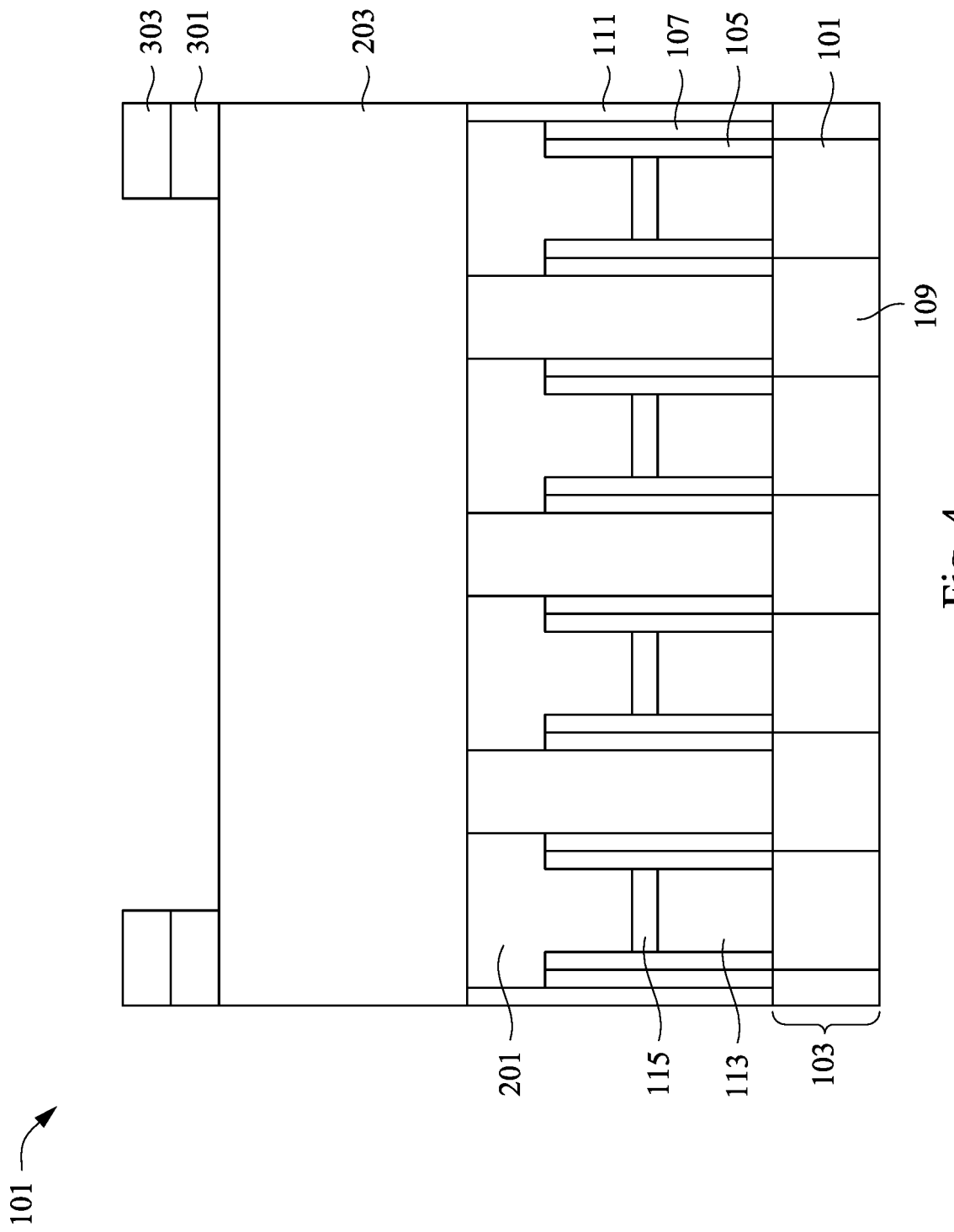
FIG. 4 illustrates a patterning of the layers in accordance with some embodiments.

FIG. 4 illustrates a patterning of the first CMD layer 301 and the second CMD layer 303 after the patterning of the third CMD layer 305 with the third CMD layer 305 removed from this view for clarity. In an embodiment the first CMD layer 301 and the second CMD layer 303 are patterned using, e.g., a second photolithographic masking and etching process. For example, a single or tri-layer photoresist is applied, exposed, and developed, and then one or more etching processes may be used to transfer the pattern of the photoresist to the underlying first CMD layer 301 and the second CMD layer 303. However, any suitable process may be utilized to pattern the first CMD layer 301 and the second CMD layer 303.

Figure 5:
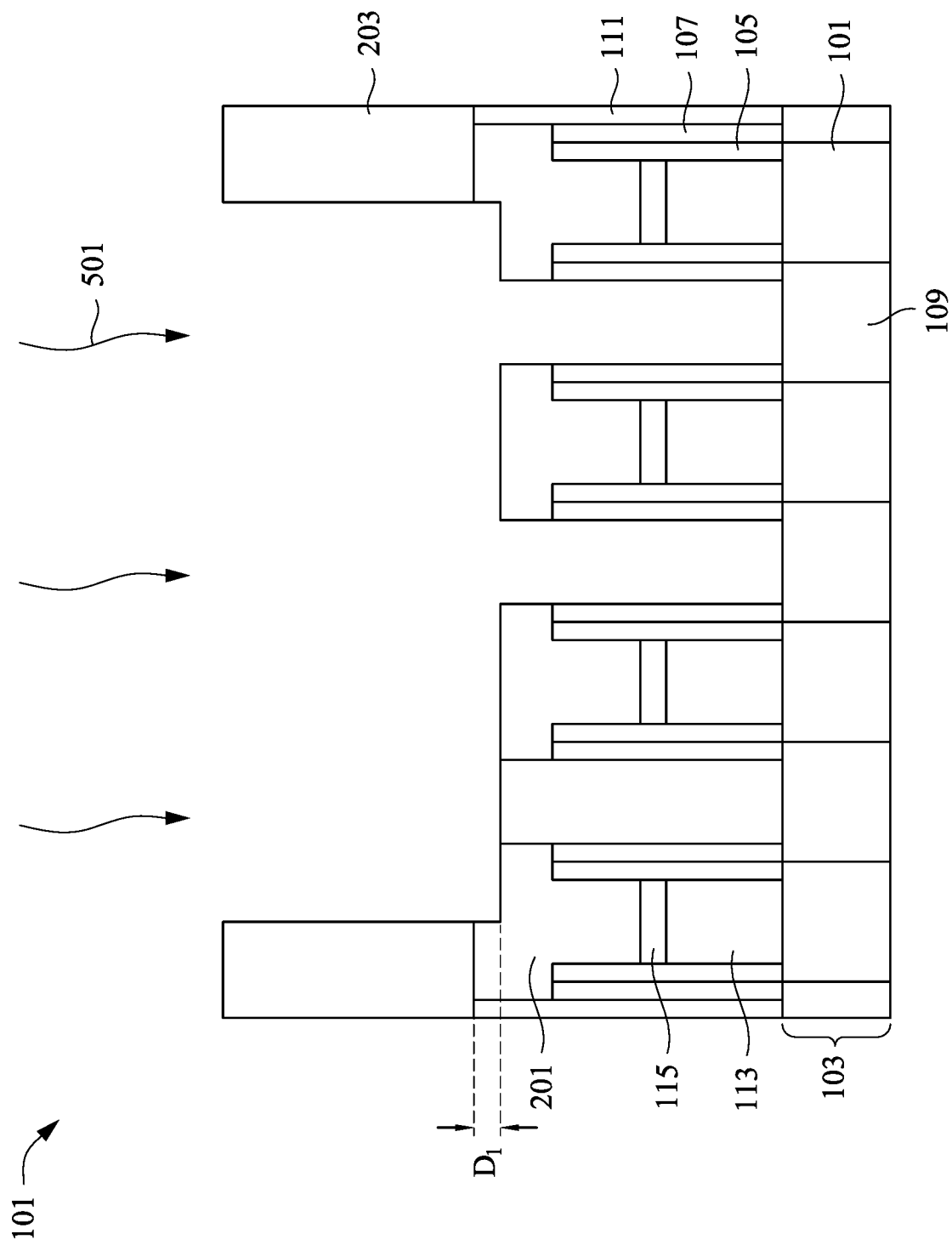
FIG. 5 illustrates a removal of an interlayer dielectric in accordance with some embodiments.

FIG. 5 illustrates a transference of the pattern of the first CMD layer 301 and the second CMD layer 303 to the second ILD layer 203 and the first ILD layer 111. In an embodiment the pattern of the first CMD layer 301 and the second CMD layer 303 may be transferred using a first etching process (represented in FIG. 5 by the arrows labeled 501). The first etching process 501 may be, e.g., one or more reactive ion etches using the first CMD layer 301 and the second CMD layer 303 as masks. However, any suitable method of transferring the pattern may be utilized.

However, with the inclusion of the first sacrificial material 201, the first sacrificial material 201 will act as a self aligned contact material that also acts as a masking material once the first etching process 501 has exposed the first sacrificial material 201 through the second ILD layer 203. Additionally, a portion of the first sacrificial material 201 may be etched by the first etching process 501 while the first etching process 501 removes the first ILD layer 111 and exposes the source/drain regions 109. As a result, one or more of the first sacrificial material 201 may have an indentation from the first etching process 501, but will still protect the underlying structure from the first etching process 501 while the source/drain regions 109 is exposed. The indentation may have an indentation distance $D_I$ of between about 4 nm and about 10 nm, such as about 6 nm, although any suitable distance may be utilized.

Once the source/drain regions 109 have been exposed, an optional silicide contact (not separately illustrated) may be formed on the source/drain regions 109. The silicide contact may comprise titanium, nickel, cobalt, or erbium in order to reduce the Schottky barrier height of the contact. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process. The thickness of the silicide contact may be between about 5 nm and about 50 nm.

Figure 6:
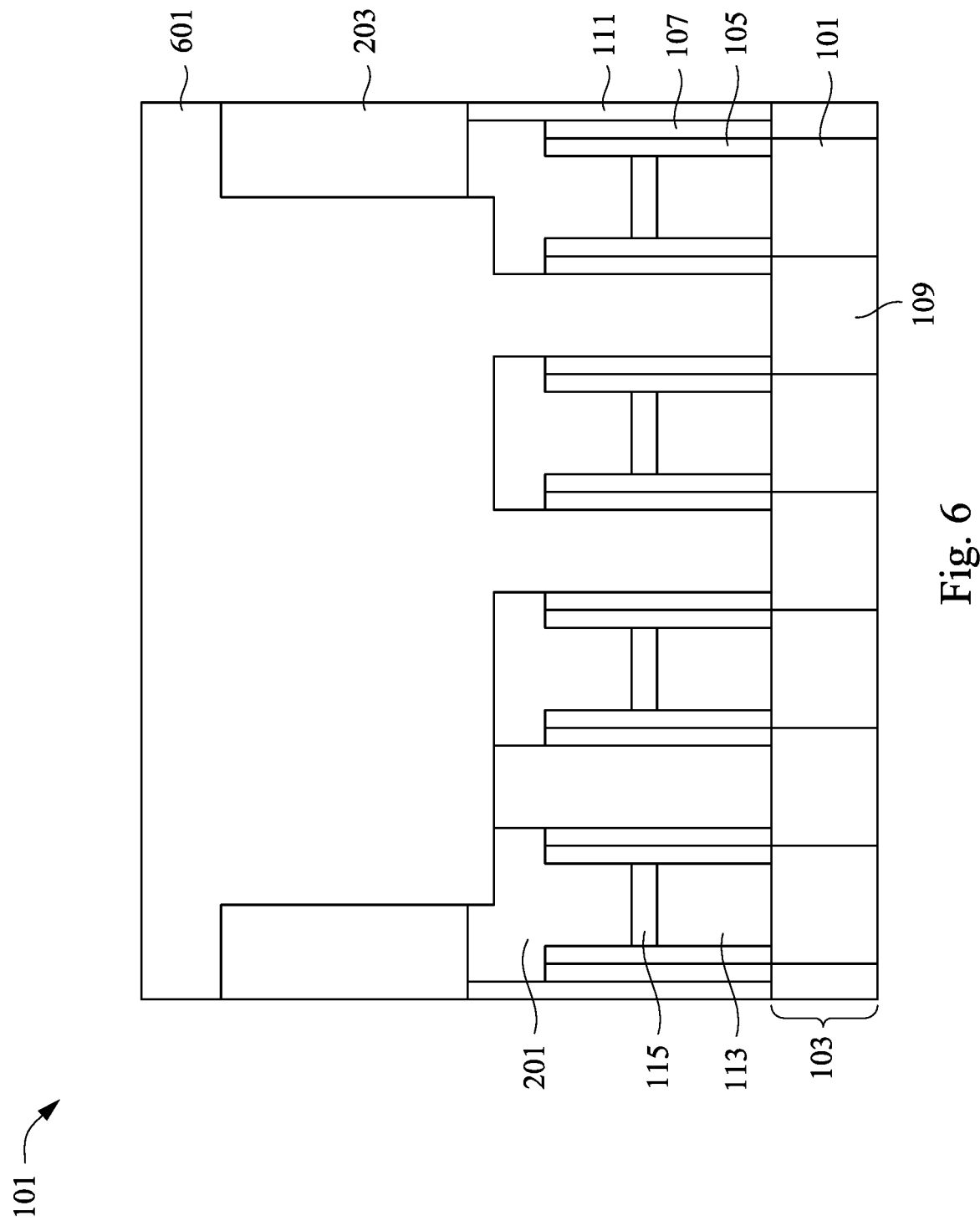
FIG. 6 illustrates a formation of a first contact material in accordance with some embodiments.

FIG. 6 illustrates a formation of a first contact material 601 in physical connection with the silicide contact (when present) or the source/drain regions 109. In an embodiment the first contact material 601 may be a conductive material such as cobalt, W, Al, Cu, AlCu, W, TaC, TaCN, TaSiN, Mn, Zr, TiN, Ta, TaN, Ni, Ti, TiAlN, Ru, Mo, or WN, although any suitable material, such as aluminum, copper, alloys of these, combinations of these, or the like, and may be deposited using a deposition process such as sputtering, chemical vapor deposition, electroplating, electroless plating, or the like, to fill and/or overfill the opening within the second ILD 203.

Figure 7:
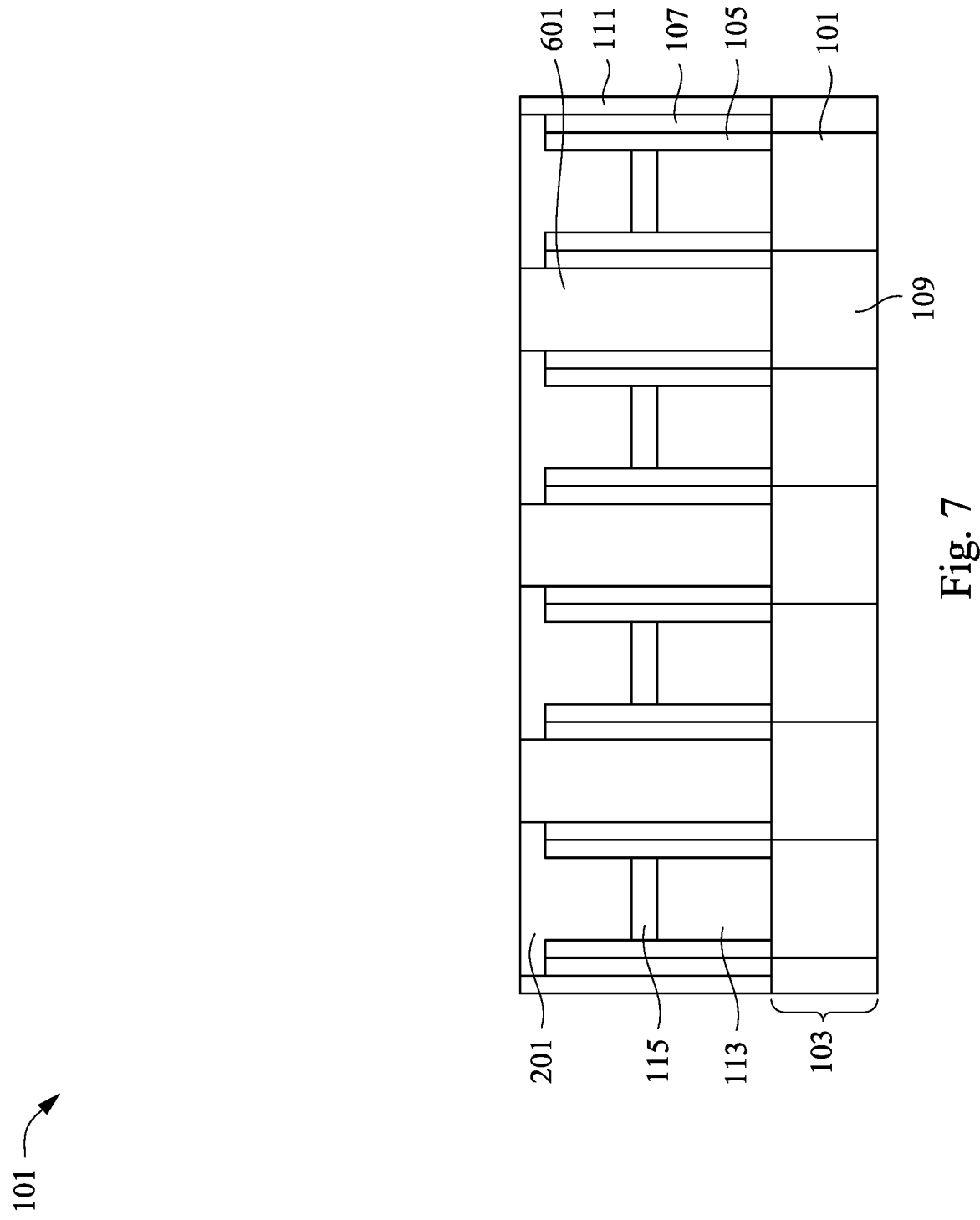
FIG. 7 illustrates a planarization process in accordance with some embodiments.

FIG. 7 illustrates that, once the first contact material 601 has been deposited, the first contact material 601 may be planarized to remove excess material. In an embodiment the first contact material 601 may be planarized using, e.g., a chemical mechanical polishing process, whereby etchants and abrasives are utilized along with a rotating platen in order to react and remove the excess material of the first contact material 601 and the first sacrificial material 201. However, any suitable planarization process may be utilized to planarize the first contact material 601 and the first sacrificial material 201.

Figure 8:
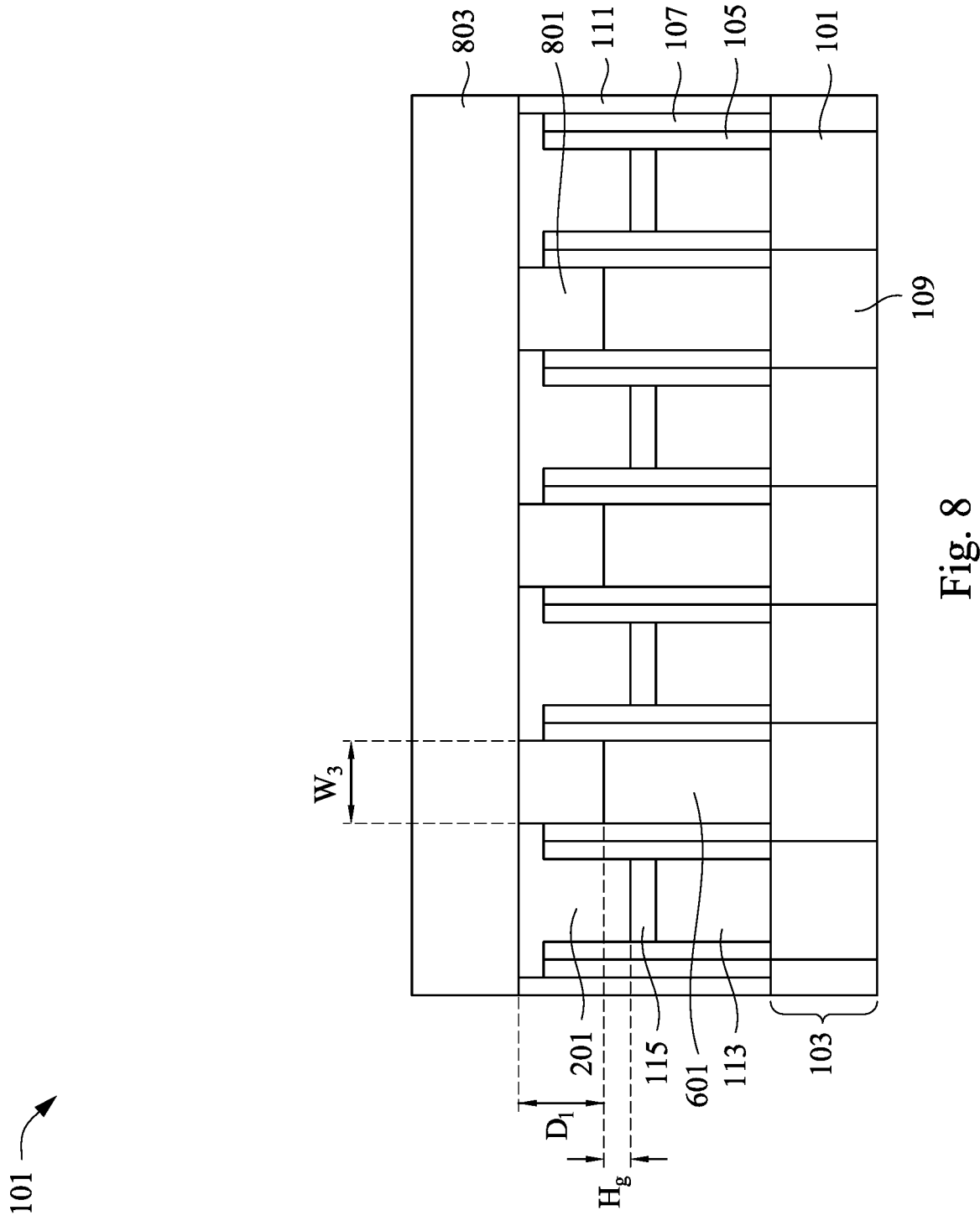
FIG. 8 illustrates a formation of a second sacrificial material in accordance with some embodiments.

FIG. 8 illustrates that, once the first contact material 601 has been planarized with the first sacrificial material 201, the first contact material 601 is recessed to a level below a top surface of the first sacrificial material 201. In an embodiment the first contact material 601 is recessed using a wet or dry etching process that uses one or more etchants that are selective to the material of the first contact material 601 (e.g., cobalt) without significantly removing the material of the first sacrificial material 201. The first sacrificial material 201 may be recessed a first distance $D_1$ of between about 18 nm and about 25 nm. However, any suitable distance may be utilized.

FIG. 8 also illustrates a deposition of a second sacrificial material 801 once the first contact material 601 has been recessed. In an embodiment the second sacrificial material 801 may be a material with a high etch selectivity to the materials of the first sacrificial material 201, the first spacers 105 and the second spacers 107. For example, the second sacrificial material 801 may have an etch selectivity to the material of the first sacrificial material 201, the first spacers 105 or the second spacers 107 of greater than about 12, such as between about 12 and about 40.

In an embodiment the second sacrificial material 801 may be a dielectric such as silicon nitride, silicon oxide (SiO2), silicon nitride (SiN), silicon carbide (SiC), aluminum oxide (AlO), aluminum nitride (AlN), zirconium oxide (ZrO), zirconium nitride (ZrN), combinations of these, or the like. However, any suitable material may be utilized. By utilizing such materials, damage to the underlying first contact material 601 can be reduced or eliminated during the etching of the second sacrificial material 801 to form a source/drain contact opening 1003 (described further below). The second sacrificial material 801 may be deposited using a deposition process such as plasma enhanced atomic layer deposition (PEALD), thermal atomic layer deposition (thermal ALD), plasma enhanced chemical vapor deposition (PECVD), wherein the process temperature can be held to be between about 250° C. and about 400° C. However, any suitable deposition and process conditions may be utilized.

The second sacrificial material 801 may be formed to fill and overfill the openings left by the recessing of the first contact material 601. Once the second sacrificial material 801 has been deposited, the second sacrificial material 801 may be planarized with the first sacrificial material 201 using, e.g., a planarization process such as a chemical mechanical polishing process, although any suitable process may be utilized. As such, the sacrificial material 801 may be formed to have a third width $W_3$ of between about 12 nm and about 15 nm, such as about 14 nm.

Additionally, by controlling the recessing of the first contact material 601, the K value of the combination of the sacrificial materials (e.g., the first sacrificial material 201 and the second sacrificial material 801) may be controlled. In particular, by controlling a height gap $H_g$ between a bottom surface of the second sacrificial material 801 and the first sacrificial material 201, the K value could be controlled, with a wider height gap $H_g$ resulting in a lower overall K value, which affects the parasitic capacitance. In a particular embodiment the height gap $H_g$ may be between about 0 nm and about 15 nm, such as about 6 nm. However, any suitable height gap $H_G$, including no height gap, may be utilized.

After the second sacrificial material 801 has been deposited and planarized, a first etch stop layer 803 is deposited over the second sacrificial material 801. In an embodiment the first etch stop layer 803 may be a material such as silicon nitride or silicon oxycarbide, combinations of these, or the like, and may be deposited using a low temperature deposition process such as chemical vapor deposition, physical vapor deposition, or atomic layer deposition.

Figure 9:
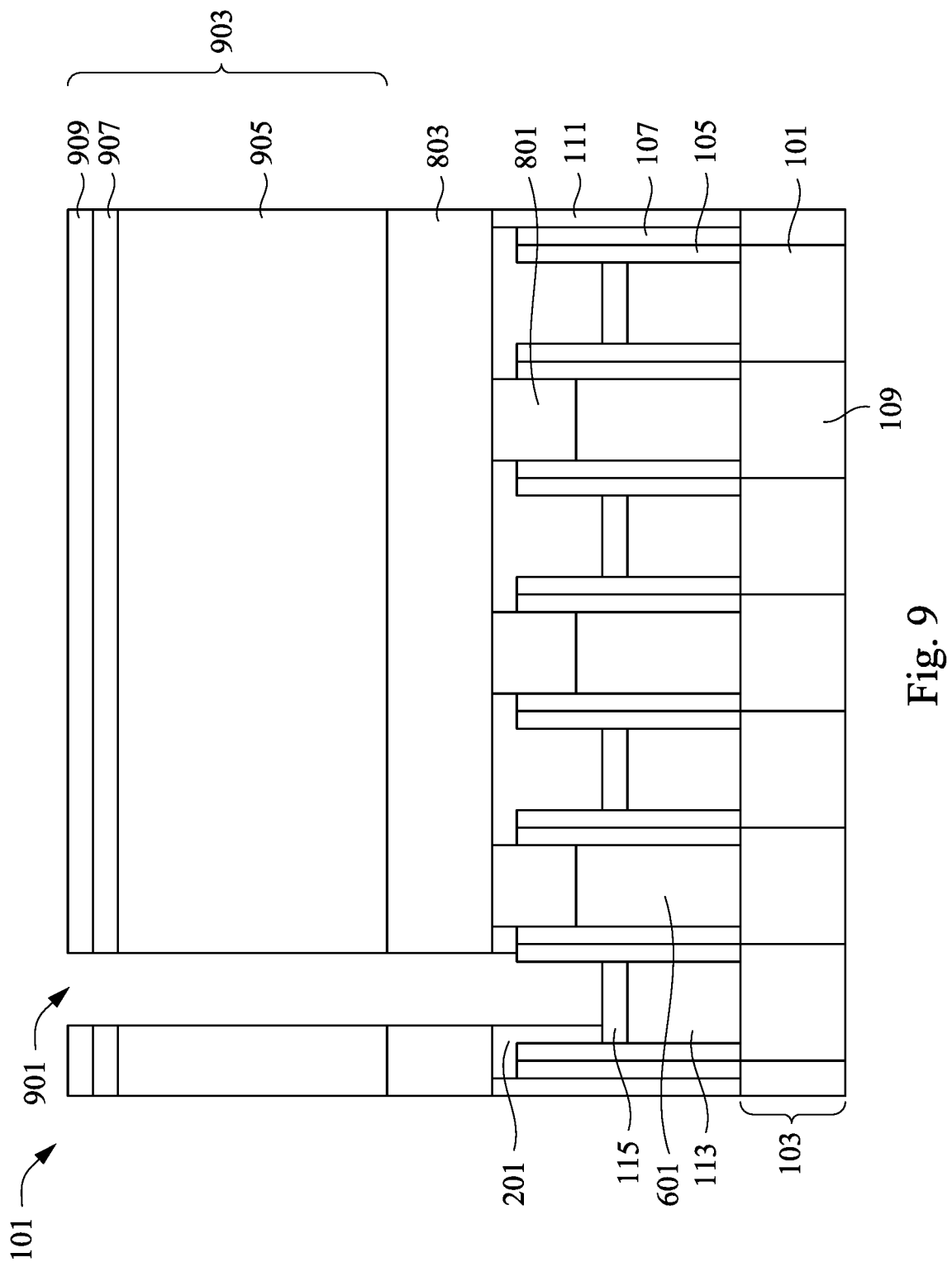
FIG. 9 illustrates a formation of a gate opening in accordance with some embodiments.

FIG. 9 illustrates that, once the first etch stop layer 803 has been formed, a metal gate contact opening 901 may be formed through the first etch stop layer 803 and the second sacrificial material 801 to expose the capping layer 115 (when present) or the gate stack 113 (when the capping layer 115 is not present). In an embodiment the metal gate contact opening 901 may be formed by initially placing a first photoresist 903 over the second sacrificial material 801. The first photoresist 903 may be a tri-layer photoresist with a bottom anti-reflective coating (BARC) layer 905, an intermediate mask layer 907, and a first top photosensitive layer 909. The BARC layer 905 is applied in preparation for an application of the first top photosensitive layer 909. The BARC layer 905, as its name suggests, works to prevent the uncontrolled and undesired reflection of energy (e.g., light) back into the overlying first top photosensitive layer 909 during an exposure of the first top photosensitive layer 909, thereby preventing the reflecting light from causing reactions in an undesired region of the first top photosensitive layer 909. Additionally, the BARC layer 905 may be used to provide a planar surface, helping to reduce the negative effects of the energy impinging at an angle.

The intermediate mask layer 907 may be placed over the BARC layer 905. In an embodiment the intermediate mask layer 907 is a hard mask material such as silicon nitride, oxides, oxynitrides, silicon carbide, combinations of these, or the like. The hard mask material for the intermediate mask layer 907 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the hardmask material may be utilized, and all such methods or combination are fully intended to be included within the scope of the embodiments. The intermediate mask layer 907 may be formed to a thickness of between about 100 Å and about 800 Å, such as about 300 Å.

In an embodiment the first top photosensitive layer 909 is applied over the intermediate mask layer 907 using, e.g., a spin-on process, and includes a photoresist polymer resin along with one or more photoactive compounds (PACs) in a photoresist solvent. The PACs will absorb the patterned light source and generate a reactant in those portions of the first top photosensitive layer 909 that are exposed, thereby causing a subsequent reaction with the photoresist polymer resin that can be developed in order to replicate the patterned energy source within the first top photosensitive layer 909.

Once each of the BARC layer 905, the intermediate mask layer 907, and the first top photosensitive layer 909 have been applied, the first top photosensitive layer 909 is exposed to a patterned energy source (e.g., light) and developed in order to create the metal gate contact opening 901 within the first top photosensitive layer 909. Once the metal gate contact opening 901 has been formed within the first top photosensitive layer 909, the first top photosensitive layer 909 may then be used as a mask to extend the pattern into the intermediate mask layer 907 and the BARC layer 905 using one or more etching processes. Similarly, once the intermediate mask layer 907 and the BARC layer 905 have been patterned, the intermediate mask layer 907 and the BARC layer 905 may be utilized as masks to extend the metal gate contact opening 901 through the first etch stop layer 803 and through the first sacrificial material 201 to expose the capping layer 115.

For example, in a particular embodiment in which the first sacrificial material 201 is zirconium oxide, the etching process to form the metal gate contact opening 901 may utilize a first etchant such as $BCl_3$ in combination with a second etchant such as $Cl_2$, although any suitable etchants may be utilized. In a particular embodiment the first etchant may have a flow rate of between about 200 sccm and about 800 sccm, such as about 300 sccm, while the second etchant may be introduced at a flow rate of between about 0 sccm and about 100 sccm, such as about 40 sccm. Additionally, the second etching process 1201 may be performed at a temperature of between about 20° C. and about 80° C., such as about 50° C., and at a pressure of between about 10 mTorr and about 80 mTorr, such as about 30 mTorr. However, any suitable process conditions may be utilized.

However, thanks to the high etch selectivity of the first sacrificial material 201 with respect to the first spacer 105, the extension through the first sacrificial material 201 can be performed without significant damage, if any, to the first spacer 105. Additionally, with the inclusion of the capping layer 115, the extension of the metal gate contact opening 901 through the first sacrificial material 201 can be stopped without damaging the materials of the underlying gate stack 113.

Figure 10:
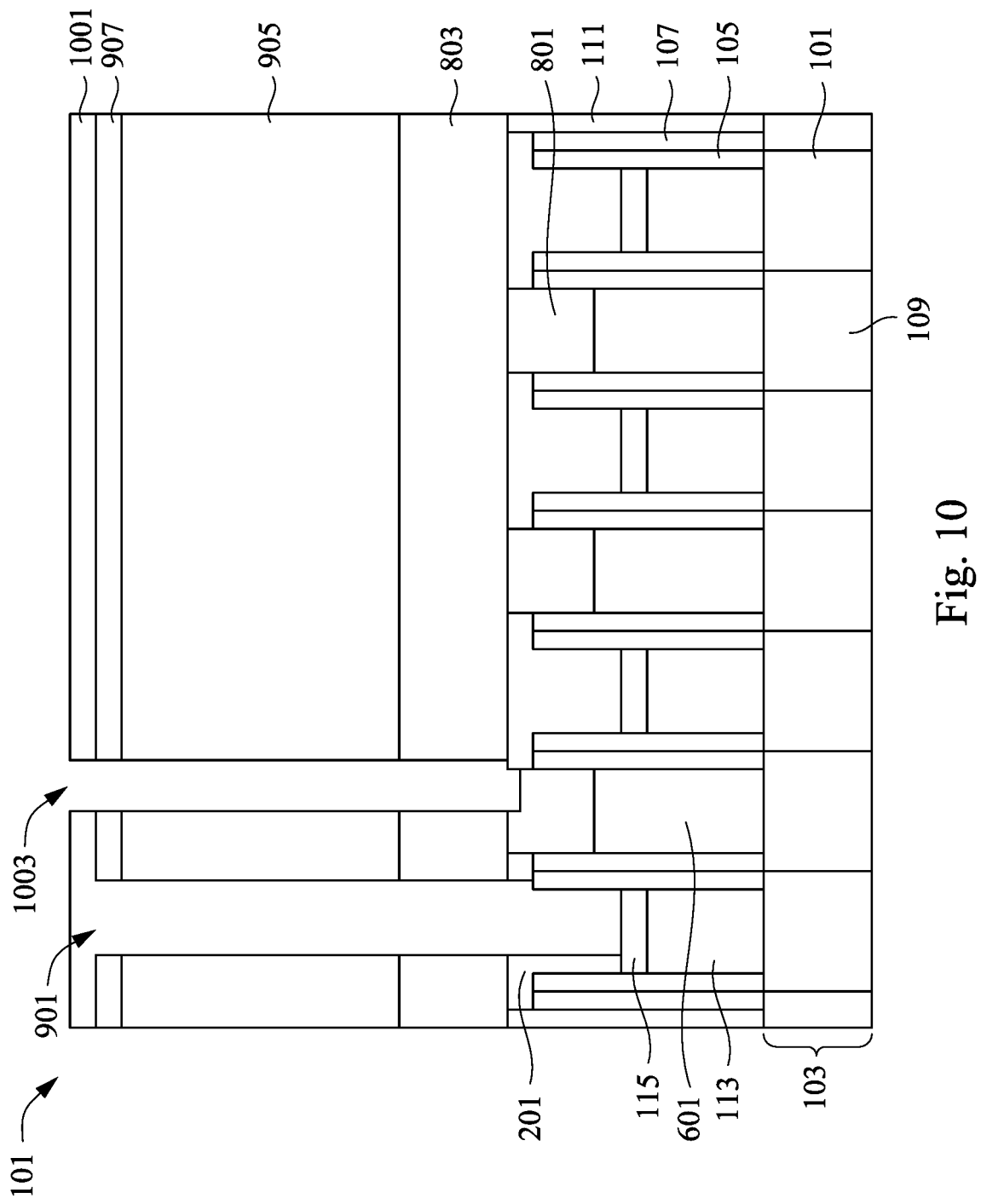
FIG. 10 illustrates a formation of a source/drain contact opening in accordance with some embodiments.

FIG. 10 illustrates a removal of the first top photosensitive layer 909 and a placement of a second top photosensitive layer 1001 in order to form a source/drain contact opening 1003. In an embodiment the first top photosensitive layer 909 may be removed using, e.g., an ashing process, whereby the temperature of the first top photosensitive layer 909 is increased until the first top photosensitive layer 909 undergoes a thermal decomposition, after which the first top photosensitive layer 909 may be easily removed. However, any suitable process, such as a wet strip, may be utilized.

Once the first top photosensitive layer 909 has been removed, the second top photosensitive layer 1001 may be placed over the intermediate mask layer 907. In an embodiment the second top photosensitive layer 1001 may be similar to the first top photosensitive layer 909 such as by comprising a photoresist polymer resin along with one or more photoactive compounds (PACs). Additionally, the second top photosensitive layer 1001 may be placed in a similar fashion, such as by applying the second top photosensitive layer 1001 using a spin-coating process. However, by using a method such as spin coating, the second top photosensitive layer 1001 will additionally fill in the metal gate contact opening 901 and protect the metal gate contact opening 901 during subsequent processing.

Once in place, the second top photosensitive layer 1001 may be patterned. In an embodiment the second top photosensitive layer 1001 is patterned to be a mask for the formation of the source/drain contact opening 1003 by exposing the second top photosensitive layer 1001 with a patterned energy source (e.g., light). Once exposed, the second top photosensitive layer 1001 may be developed to pattern the source/drain contact opening 1003 into the second top photosensitive layer 1001. Once the source/drain contact opening 1003 has been formed within the second top photosensitive layer 1001, the second top photosensitive layer 1001 may then be used as a mask to extend the pattern into the intermediate mask layer 907 and the BARC layer 905 using one or more etching processes. Similarly, once the intermediate mask layer 907 and the BARC layer 905 have been patterned, the intermediate mask layer 907 and the BARC layer 905 may be utilized as masks to extend the source/drain contact opening 1003 through the first etch stop layer 803.

Additionally, once the source/drain contact opening 1003 has been extended through the first etch stop layer 803, the source/drain contact opening 1003 is then extended into the second sacrificial material 803. However, because of the selectivity of the second sacrificial material 803, the source/drain contact opening 1003 at this point extends partially through the second sacrificial material 803 and does not extend all of the way through the second sacrificial material 803.

Figure 11:
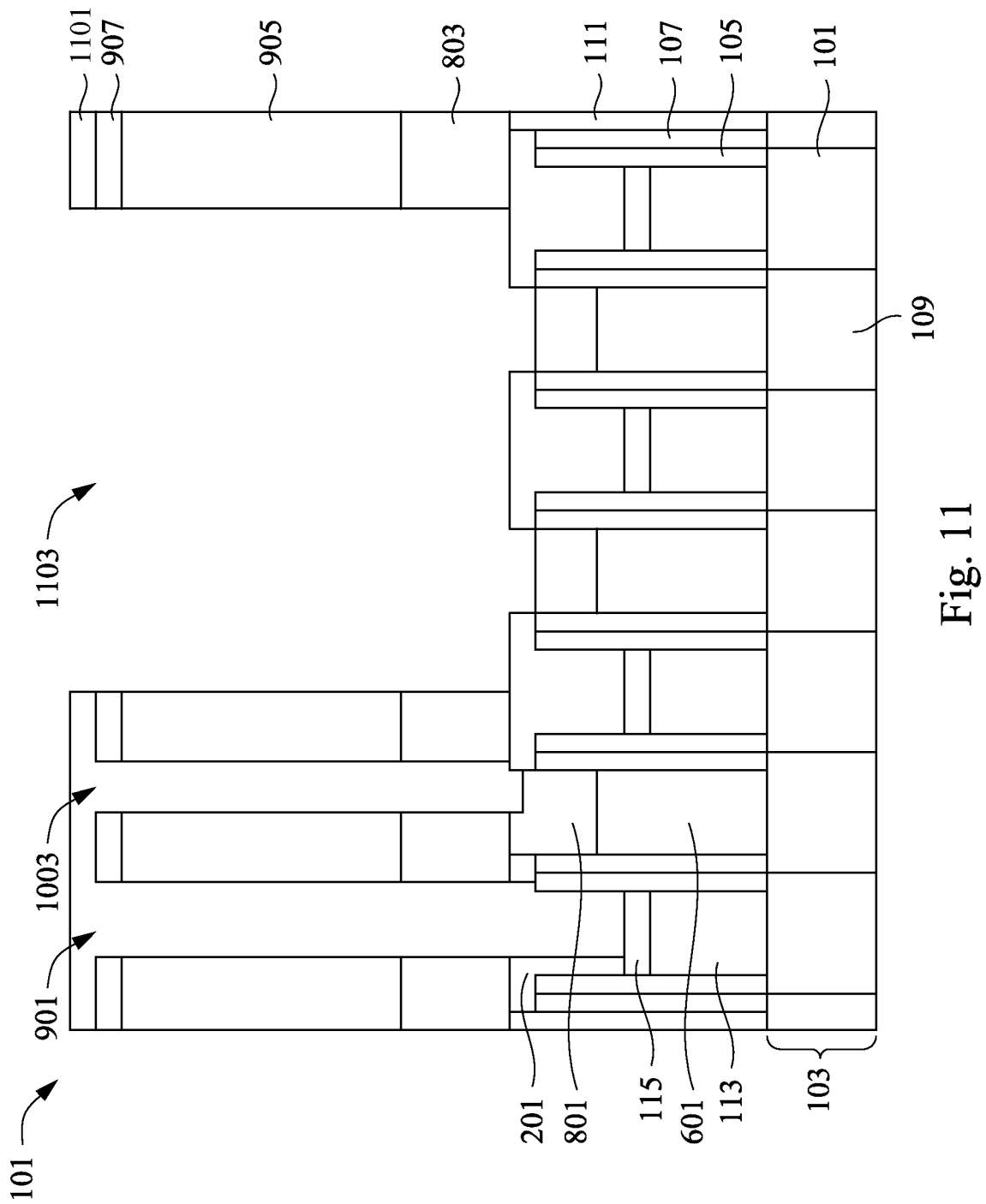
FIG. 11 illustrates a formation of a rail opening in accordance with some embodiments.

FIG. 11 illustrates a removal of the second top photosensitive layer 1001 and a placement of a third top photosensitive layer 1101 in order to form a rail opening 1103. In an embodiment the second top photosensitive layer 1001 may be removed using, e.g., an ashing process, whereby the temperature of the second top photosensitive layer 1001 is increased until the second top photosensitive layer 1001 undergoes a thermal decomposition, after which the second top photosensitive layer 1001 may be easily removed. However, any suitable process, such as a wet strip, may be utilized.

Once the second top photosensitive layer 1001 has been removed, the third top photosensitive layer 1101 may be placed over the intermediate mask layer 907. In an embodiment the third top photosensitive layer 1101 may be similar to the first top photosensitive layer 909 such as by comprising a photoresist polymer resin along with one or more photoactive compounds (PACs). Additionally, the third top photosensitive layer 1101 may be placed in a similar fashion, such as by applying the third top photosensitive layer 1101 using a spin-coating process. However, by using a method such as spin coating, the third top photosensitive layer 1101 will additionally fill in the metal gate contact opening 901 and the source/drain contact opening 1003 and protect both the metal gate contact opening 901 and the source/drain contact opening 1003 during subsequent processing.

Once in place, the third top photosensitive layer 1101 may be patterned. In an embodiment the third top photosensitive layer 1101 is patterned to be a mask for the formation of a rail opening 1103 by exposing the third top photosensitive layer 1101 with a patterned energy source (e.g., light). Once exposed, the third top photosensitive layer 1101 may be developed to pattern the rail opening 1103 into the third top photosensitive layer 1101. Once the rail opening 1103 has been formed within the third top photosensitive layer 1101, the third top photosensitive layer 1101 may then be used as a mask to extend the pattern into the intermediate mask layer 907 and the BARC layer 905 using one or more etching processes. Similarly, once the intermediate mask layer 907 and the BARC layer 905 have been patterned, the intermediate mask layer 907 and the BARC layer 905 may be utilized as masks to extend the rail opening 1103 through the first etch stop layer 803 and through the first sacrificial material 201 to expose the capping layer 115.

Additionally, once the rail opening 1103 has been extended through the first etch stop layer 803, the rail opening 1103 is then extended into the second sacrificial material 803. However, because of the selectivity of the second sacrificial material 803, the rail opening 1103 at this point extends partially through the second sacrificial material 803 and does not extend all of the way through the second sacrificial material 803.

Figure 12:
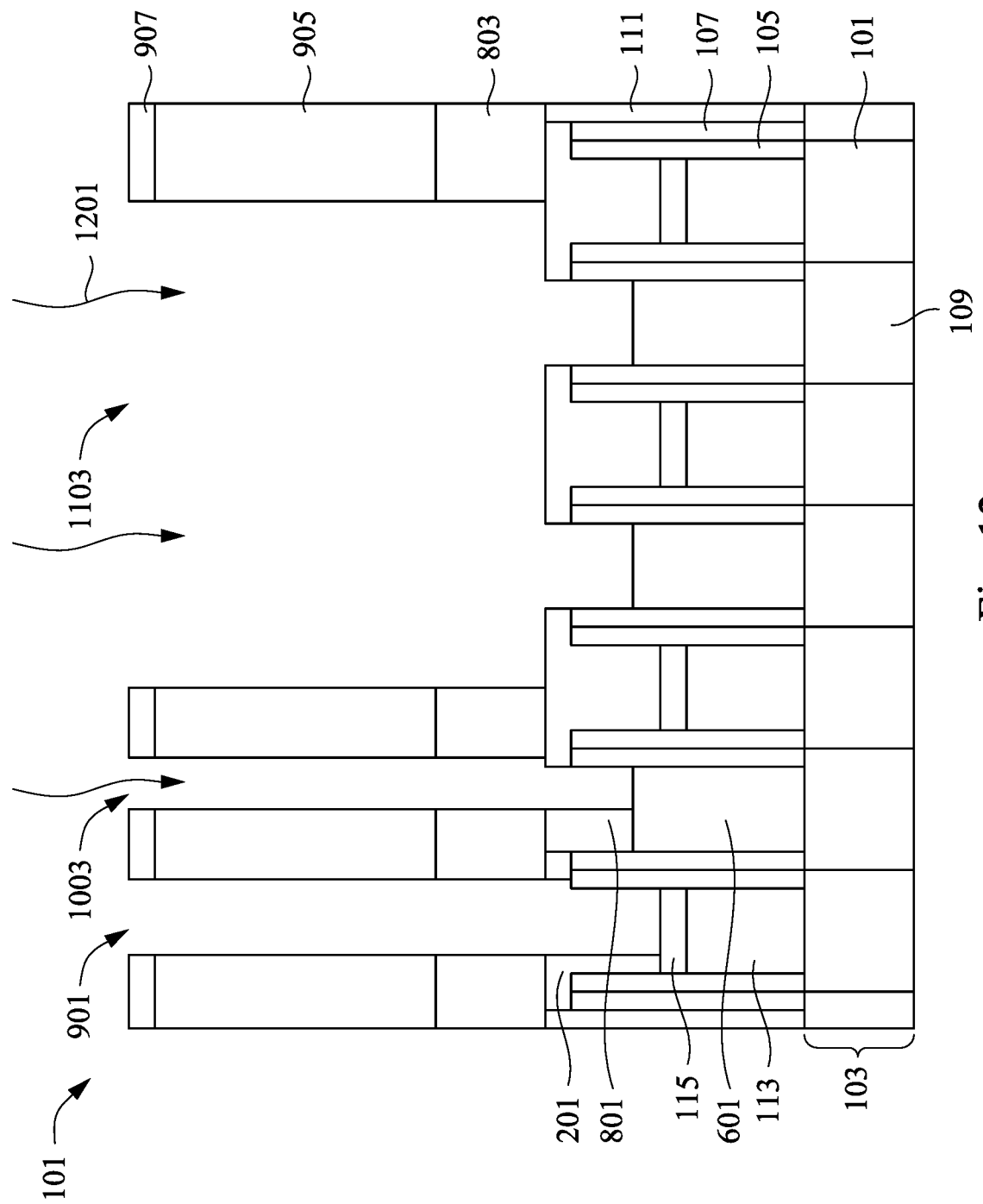
FIG. 12 illustrates a break-through etching process in accordance with some embodiments.

FIG. 12 illustrates that, once the metal gate contact opening 901, the source/drain contact opening 1003, and the rail opening 1103 have been formed, the third top photosensitive layer 1101 is removed. In an embodiment the third top photosensitive layer 1101 may be removed using, e.g., an ashing process, whereby the temperature of the third top photosensitive layer 1101 is increased until the third top photosensitive layer 1101 undergoes a thermal decomposition, after which the third top photosensitive layer 1101 may be easily removed. However, any suitable process, such as a wet strip, may be utilized.

Once the third top photosensitive layer 1101 has been removed, a second etching process (represented in FIG. 12 by the arrows labeled 1201) may be utilized to extend the source/drain contact opening 1003 and the rail opening 1103 through the second sacrificial material 803. In an embodiment the second etching process 1201 may be, e.g., a dry etch such as a reactive ion etch using etchants that are selective to the material of the second sacrificial material 803 (e.g., SiN). However, any suitable process may be utilized.

After the source/drain contact opening 1003 and the rail opening 1103 have been fully extended, a pre-clean may be performed. In an embodiment the pre-clean process may be either a plasma or non-plasma process that is utilized to clean and remove any remaining residues left over after the third top photosensitive layer 1101 has been removed.

Figure 13A:
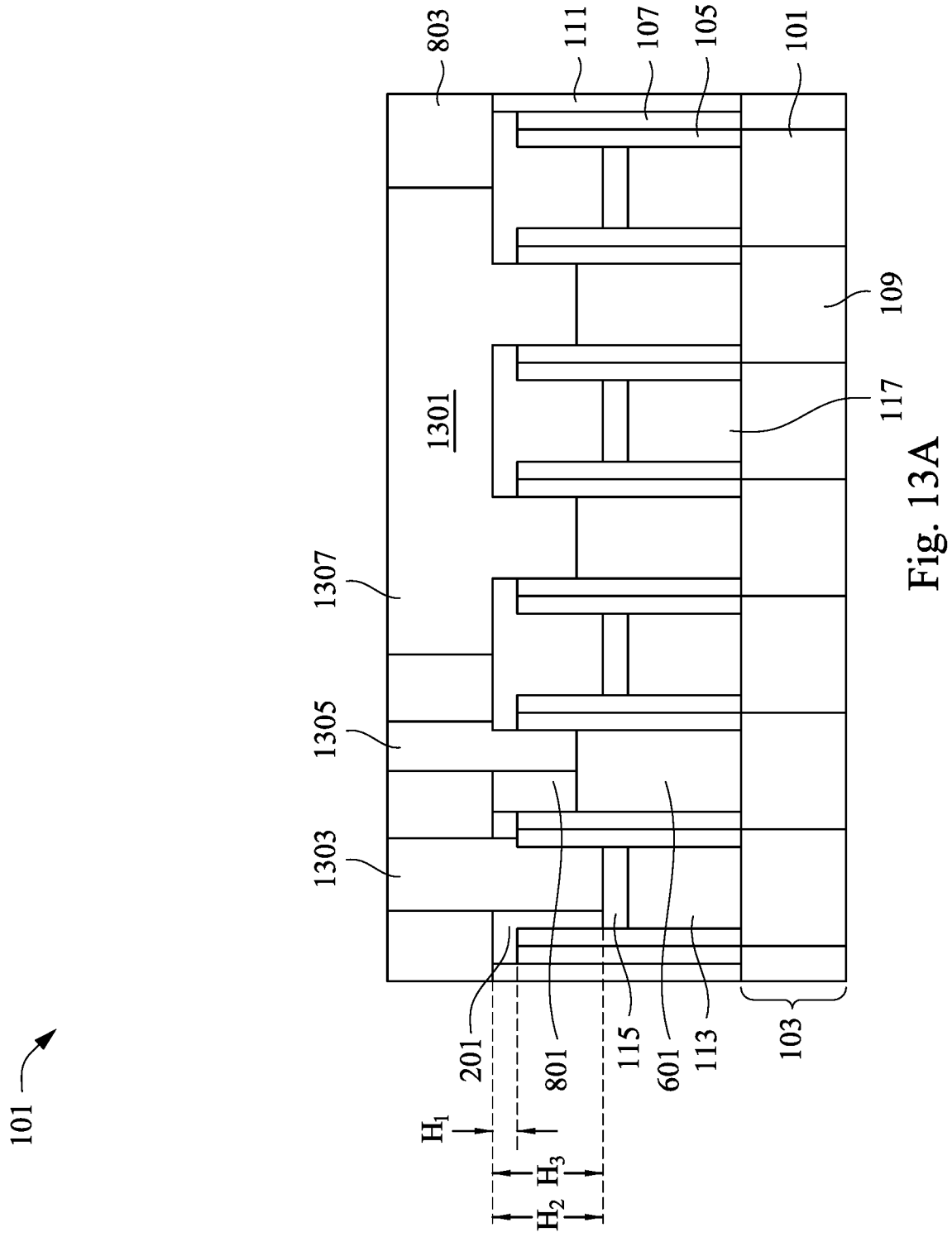
FIGS. 13A-13B illustrate a forming of contacts in accordance with some embodiments.

FIG. 13A illustrates a filling of the metal gate contact opening 901, the source/drain contact opening 1003, and the rail opening 1103. In an embodiment the metal gate contact opening 901, the source/drain contact opening 1003, and the rail opening 1103 may be filled with a conductive material 1301 such as cobalt, Al, Cu, AlCu, W, Ti, TiAlN, TaC, TaCN, TaSiN, Mn, Zr, TiN, Ta, TaN, Ni, combinations of these, or the like, in order to form vias and rails. The conductive material 1301 may be deposited using a deposition or plating process. However, any suitable process or material may be utilized.

FIG. 13A additionally illustrates that, after the conductive material 1301 has been deposited to fill and overfill the openings, the conductive material 1301 and the first etch stop layer 803 may be planarized. In an embodiment the materials may be planarized with the first ILD 111 using, e.g., a chemical mechanical polishing process, although any suitable process, such as grinding or etching, may be utilized. The planarizing forms a gate contact 1303, a source/drain contact 1305, and a rail contact 1307.

Figure 13B:
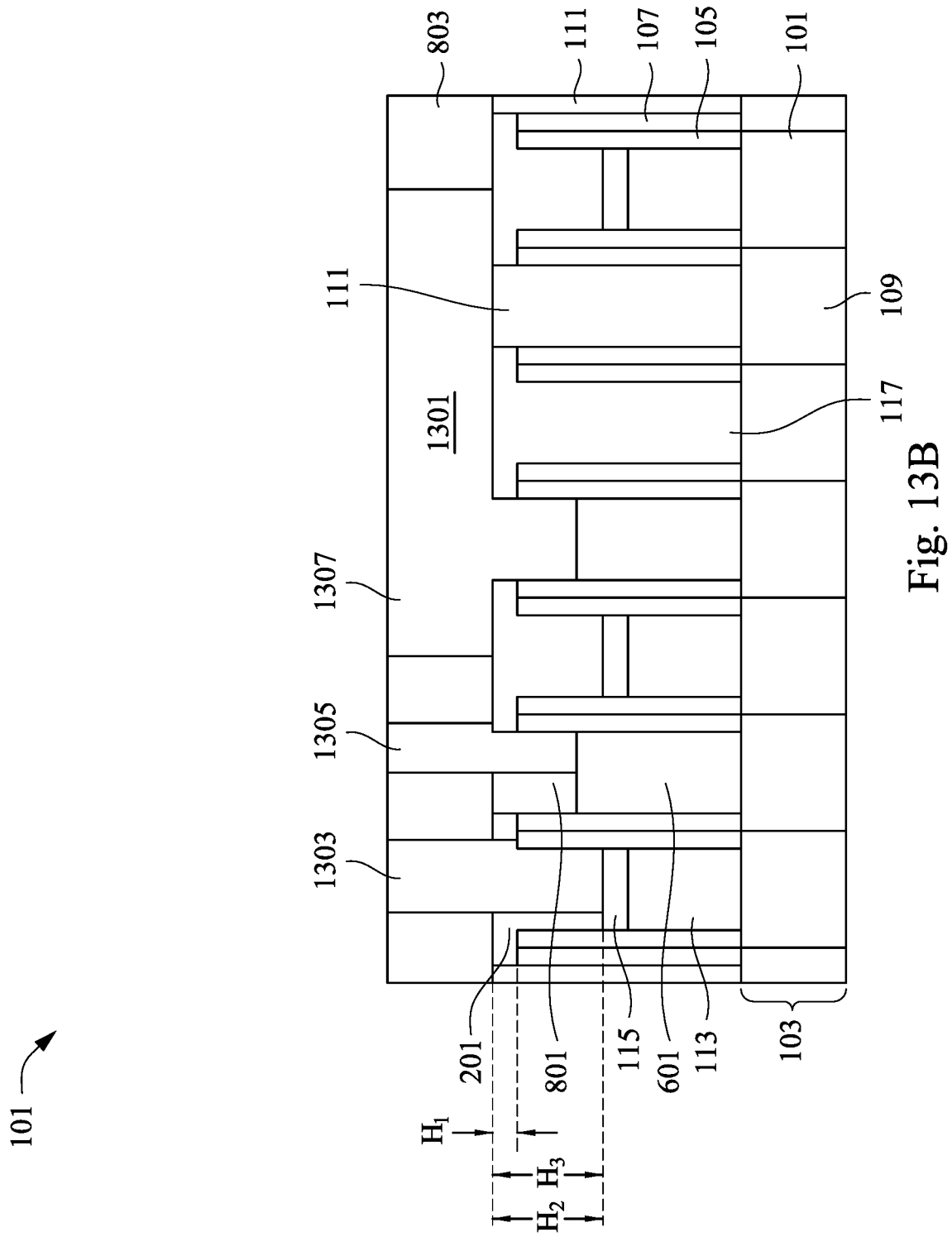

FIG. 13B illustrates the cross-sectional view of FIG. 3B (described above). As can be seen, in FIG. 13B a portion of the conductive material 1301 extends over the remaining dummy gate electrode 117 and the remaining portion of the first ILD layer 111. However, any suitable design may be utilized.

By enhancing the etch selectivity between the various materials as described above, the final height of the first sacrificial material 201 may be reduced to a first height $H_1$ over the first spacers 105 of between about 3 nm and about 10 nm, such as about 5 nm and an overall second height $H_2$ of between about 18 nm and about 30 nm, such as about 22 nm. As such, by reducing the height of the first sacrificial material 201, the overall height of the gate (including the gate stack 113, the capping layer 115, and the first sacrificial material 201) may be reduced to a third height $H_3$ of between about 50 nm and about 80 nm, such as about 60 nm. Additionally, the aspect ratio of the gate (including the gate stack 113, the capping layer 115, and the first sacrificial material 201) may be reduced to be between about 4 and about 7, such as about 5.

By lowering the gate height requirement, the front end of line etching and clean process window will be enhanced. For example, with less etching needed, etch residues will be reduced while poly line collapsing (with reduced or no lateral damage) and bending issues (e.g., bowing) will be reduced and the process will also provide a more robust etch process window in the middle end of line etching process. Such improvements can be achieved with a wider etch process condition control while also leading to an improved yield.

Figure 14:
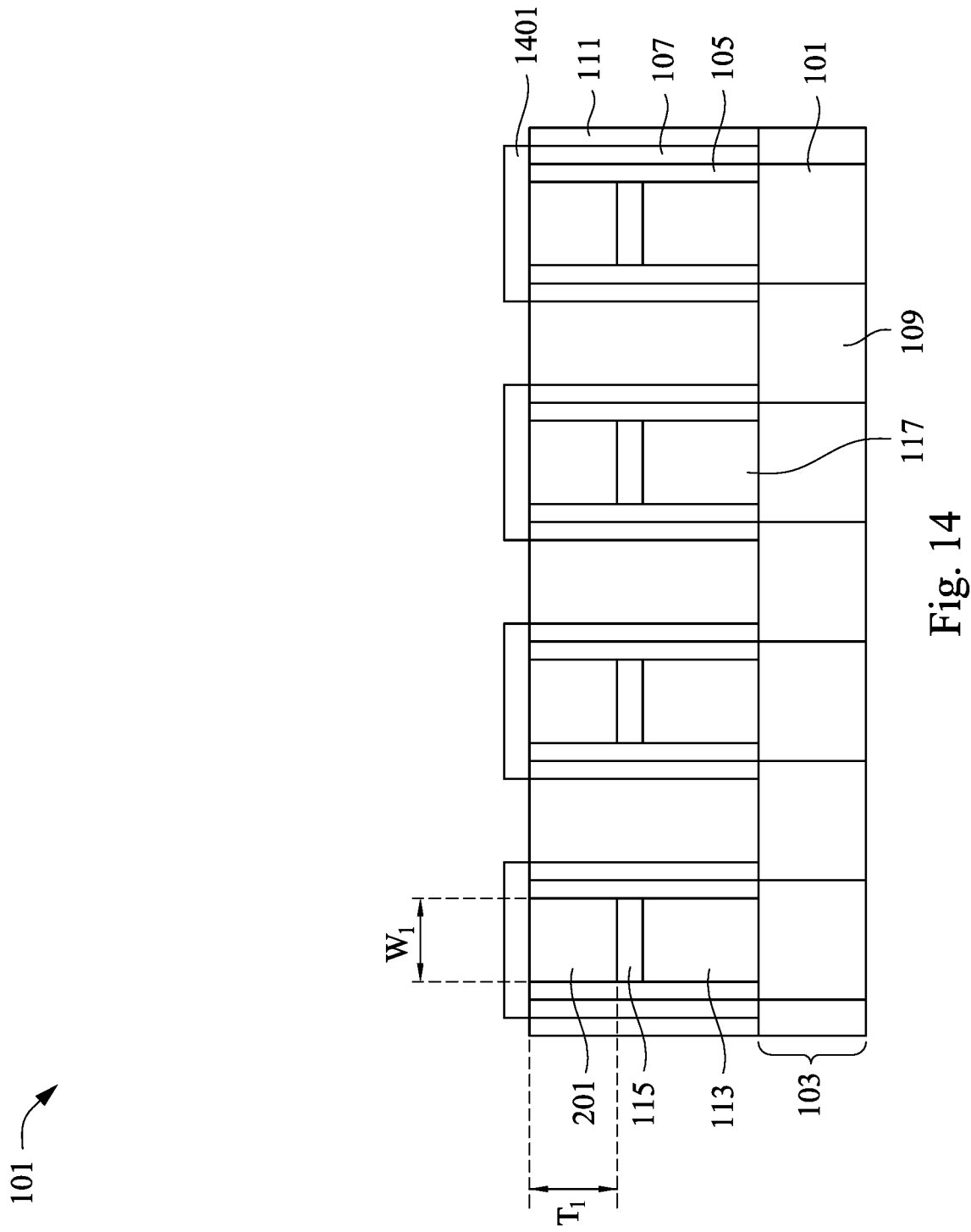
FIGS. 14-15 illustrate an embodiment using a helmet material in accordance with some embodiments.

FIG. 14 illustrates another embodiment in which a helmet material 1401 is utilized to further enhance the selectivity of the first sacrificial material 201 during the etching process. In this embodiment, once the first sacrificial material 201 has been deposited (as described above with respect to FIG. 2), instead of planarizing the first sacrificial material 201 to be planar with the first ILD layer 111, the first sacrificial material 201 is planarized to be planar with each of the first ILD layer 111, the first spacers 105, and the second spacers 107. As such, the first sacrificial material 201 is formed to have the first portion with the first width $W_1$ and the first thickness $T_1$.

Once the first sacrificial material 201 has been planarized, the helmet material 1401 is deposited. In an embodiment the helmet material 1401 helps to enhance the etch selectivity of the surrounding materials and may have an etch selectivity to each of the first sacrificial material 201, the first spacer 105, the second spacer 107, and the second sacrificial material 801 of greater than about 12. In particular embodiments the helmet material 1401 comprises a material such as silicon, silicon nitride, silicon oxide, silicon carbide, aluminum oxide, aluminum nitride, zirconium oxide, yttrium silicon oxide (YSiO), yttrium oxide ($Y_2O_3$), combinations of these, or the like. However, any suitable material may be utilized.

In another embodiment the added protection afforded by the use of the helmet material 1401 may be achieved by using the same material as the material utilized for the first sacrificial material 201 (described above with respect to FIG. 2). In this embodiment, the helmet material 1401 is utilized to increase the thickness of the first sacrificial material 201 by the thickness of the helmet material 1401.

Such an embodiment would be a separate and different method of obtaining the structure illustrated in FIG. 2. By utilizing the same material, the first spacer 105 and the second spacer 107 may be protected during subsequent etching process from bad photo overlays and bad critical dimension uniformity (CDU).

The helmet material 1401 may be deposited using a deposition process such as plasma enhanced atomic layer deposition (PEALD), thermal atomic layer deposition (thermal ALD), plasma enhanced chemical vapor deposition (PECVD). Additionally, during the deposition process the process temperature can be held to be between about 250° C. and about 400° C. However, any suitable deposition and process conditions may be utilized.

Once the helmet material 1401 has been deposited, the helmet material 1401 can be patterned such that the helmet material 1401 is located over the gate stack 113, the first spacers 105, and the second spacers 107, while exposing the first ILD layer 111 between the gate stacks 113 for further processing. In an embodiment the helmet material 1401 is patterned using a photolithographic masking and etching process. However, any suitable method of patterning the helmet material 1401 may be utilized.

Figure 15:
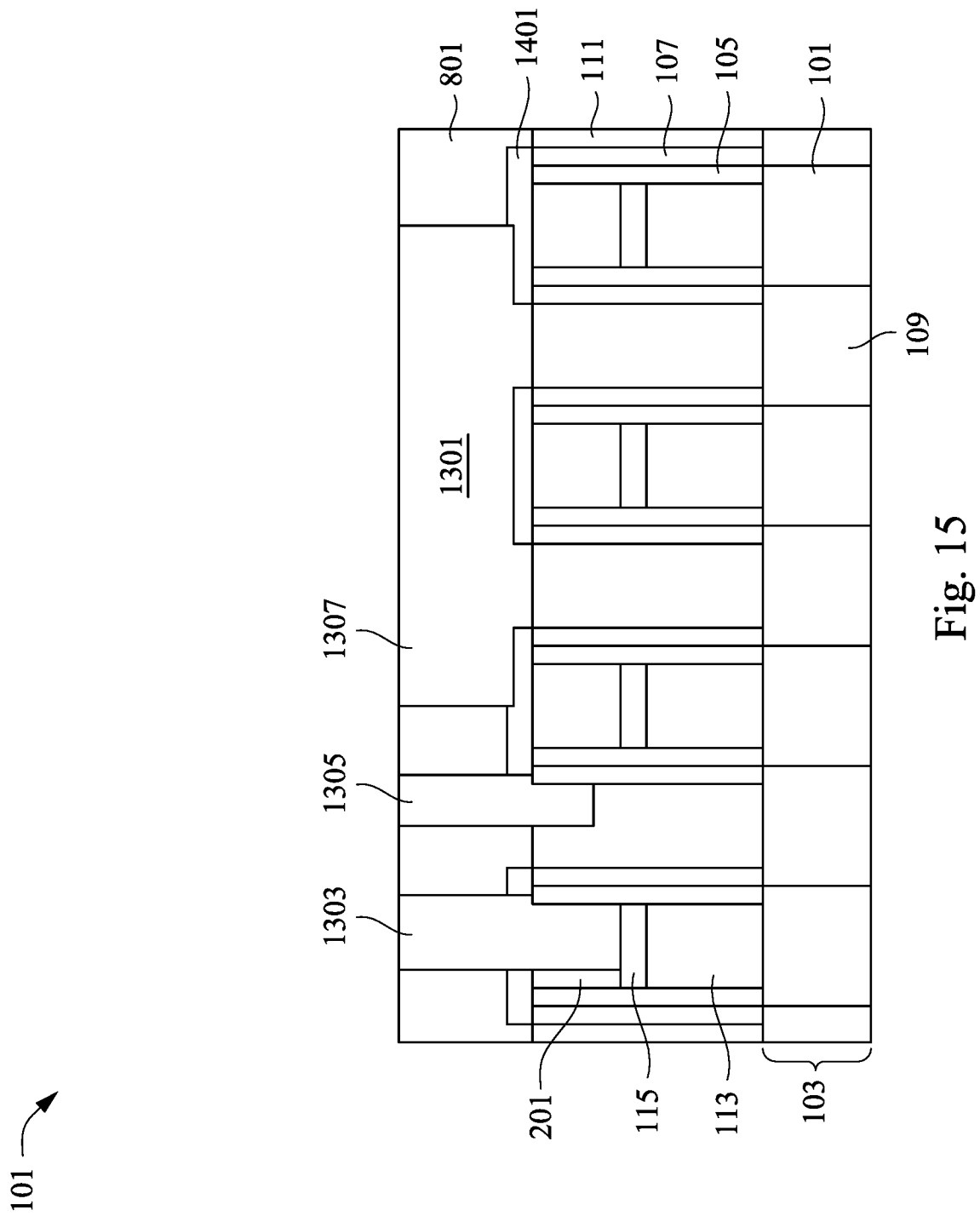

FIG. 15 illustrates that, once the helmet material 1401 has been deposited and patterned, the remainder of the process described above with respect to FIGS. 2-13 may be continued. However, with the added presence of the helmet material 1401, a larger etch selectivity may be achieved during the etching processes. Such added etch selectivity helps to prevent damage during the etching processes.

Figure 16:
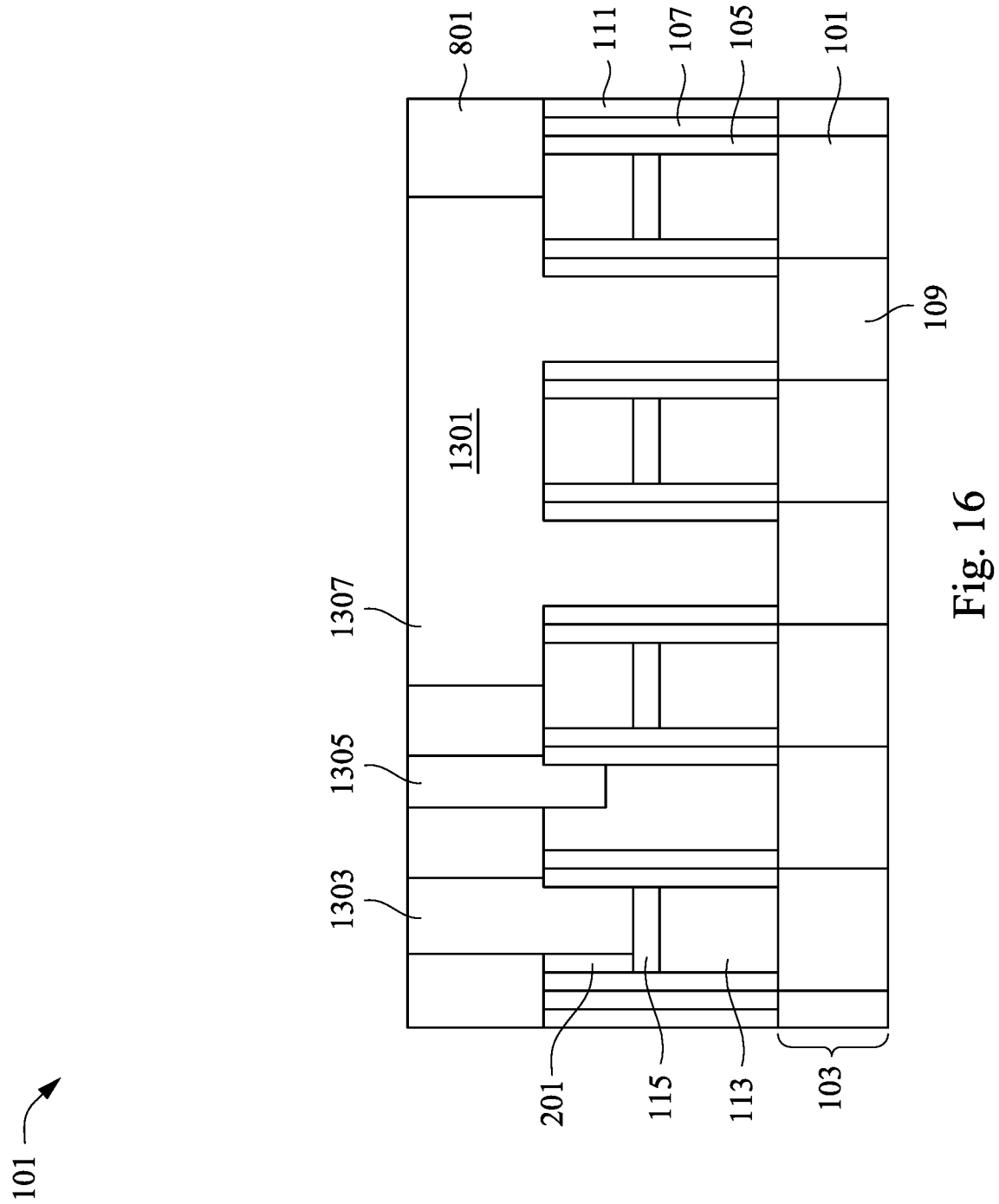
FIG. 16 illustrates an embodiment without the helmet material in accordance with some embodiments.

FIG. 16 illustrates yet another embodiment similar to the embodiment described above with respect to FIGS. 14-15. However, in this embodiment, while the first sacrificial material 201 is planarized with each of the first ILD layer 111, the first spacers 105, and the second spacers 107 (as described above with respect to FIG. 14), the helmet material 1401 is not deposited. As such, the first sacrificial material 201 may be formed with planar sidewalls. Further, by removing the process steps related to the helmet material 1401, a simpler process may be obtained.

Additionally, while many embodiments have been discussed in order to enhance the selectivity of the various materials to achieve a smaller gate height, a wide variety of combinations may be achieved between the materials of the first sacrificial material 201, the first spacers 105 (or the second spacers 107), the second sacrificial material 801, and the helmet material 1401. Table 1 below, without limiting the embodiments described herein, illustrate some of the various embodiments that may be utilized for each of the materials.

TABLE 1

| | First Sacrificial Material | Spacer | Second Sacrificial Material | Helmet Material |
|---|---|---|---|---|
| 1 | SiN | SiOC | SiN | ZrO |
| 2 | ZrO | SiOC | SiN | ZrO |
| 3 | SiN | SiOCN | SiOC | none |
| 4 | SiN | SiOCN | SiOC | Si |
| 5 | SiOC | SiOCN | SiN | none |
| 6 | SiO2 | SiOC | SiN | none |
| 7 | SiN | SiOCN | SiC | Si |
| 8 | SiN | SiOCN | AlO | Si |
| 9 | SiN | SiOCN | SiCN | none |
| 10 | SiN | SiOCN | AlN | none |

In accordance with an embodiment, a method of manufacturing a semiconductor device includes forming gate spacers over a semiconductor fin; forming a first gate stack adjacent to the gate spacers; forming a second gate stack over the semiconductor fin; forming a first sacrificial material over the first gate stack and the second gate stack, wherein the first sacrificial material has an etch selectivity to the gate spacers of greater than about 12; placing a first conductive material and a second sacrificial material into a region between the first gate stack and the second gate stack and between the first sacrificial material over the first gate stack and the first sacrificial material over the second gate stack, wherein the second sacrificial material is different from the first sacrificial material and has an etch selectivity to the gate spacers of greater than about 12; etching a first opening through the first sacrificial material; and etching a second opening through the second sacrificial material. In an embodiment the first sacrificial material has an etch selectivity to the second sacrificial material of greater than about 12. In an embodiment the method further includes planarizing the first sacrificial material with the gate spacers. In an embodiment the method further includes forming a helmet material over the first sacrificial material and over the gate spacers after the planarizing the first sacrificial material. In an embodiment the helmet material has a selectivity to the first sacrificial material of greater than about 12. In an embodiment the helmet material is a first material and the first sacrificial material is the first material. In an embodiment the forming the first sacrificial material forms zirconium oxide.

In accordance with another embodiment, a method of manufacturing a semiconductor device includes placing a first photoresist over a first sacrificial material over a substrate; forming a first opening through a first portion of the first sacrificial material to expose a capping layer over a gate stack and to expose a sidewall of a gate spacer, wherein the gate spacer and the first sacrificial material have an etch selectivity during the forming the first opening of greater than about 12; placing a second photoresist over a second sacrificial material, wherein the second sacrificial material and the gate spacer have an etch selectivity of greater than about 12; forming a second opening at least partially through the second sacrificial material; after stopping the forming the second opening, extending the second opening through the second sacrificial material to expose a source/drain contact; and filling the first opening and the second opening with a conductive material. In an embodiment the capping layer is in physical contact with the gate stack. In an embodiment the capping layer comprises tungsten. In an embodiment the forming the second opening exposes a surface of a second portion the first sacrificial material. In an embodiment the method further includes depositing a source/drain contact material; recessing the source/drain contact material from a first region; and filling the first region with the second sacrificial material. In an embodiment there is a gap height between the second sacrificial material and the first sacrificial material. In an embodiment the method further includes forming a helmet material over the first sacrificial material prior to the placing the first photoresist.

In accordance with yet another embodiment a semiconductor device includes a gate stack; a capping layer over the gate stack; a first sacrificial layer over the capping layer; a gate contact extending through the first sacrificial layer and in physical contact with the capping layer; a first spacer adjacent to and in physical contact with each of the gate stack, the capping layer, and the gate contact; a source/drain contact adjacent to the first spacer; a second sacrificial layer over the source/drain contact, the second sacrificial layer being different from the first sacrificial layer; and a source/ drain contact plug extending through the second sacrificial layer and in physical contact with the source/drain contact plug. In an embodiment the first sacrificial layer extends over a portion of the first spacer. In an embodiment the first sacrificial layer is planar with the first spacer. In an embodiment there is a gap height between the first sacrificial layer and the second sacrificial layer. In an embodiment the semiconductor device further includes a helmet material over the first sacrificial layer and the first spacer. In an embodiment the first spacer comprises a first material adjacent to the gate stack and a second material on an opposite side of the first material from the metal stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming gate spacers over a semiconductor fin;
   forming a first gate stack adjacent to the gate spacers;
   forming a second gate stack over the semiconductor fin;
   forming a first sacrificial material over the first gate stack and the second gate stack, wherein the forming the first sacrificial material forms zirconium oxide;
   placing a first conductive material and a second sacrificial material into a region between the first gate stack and the second gate stack and between the first sacrificial material over the first gate stack and the first sacrificial material over the second gate stack, wherein the second sacrificial material is different from the first sacrificial material;
   etching a first opening through the first sacrificial material; and
   etching a second opening through the second sacrificial material.

2. The method of claim 1, wherein the second sacrificial material comprises silicon.

3. The method of claim 1, further comprising planarizing the first sacrificial material to be level or co-planar with the gate spacers.

4. The method of claim 3, further comprising forming a helmet material over the first sacrificial material and over the gate spacers after the planarizing the first sacrificial material.

5. The method of claim 4, wherein the helmet material has a chlorine-based dry etch selectivity to the first sacrificial material of greater than about 12.

6. The method of claim 4, wherein the helmet material is a first material and the first sacrificial material is the first material.

7. The method of claim 1, wherein there is a gap height between the second sacrificial material and the first sacrificial material.

8. A method of manufacturing a semiconductor device, the method comprising:
   placing a first photoresist over a first sacrificial material over a substrate;
   forming a first opening through a first portion of the first sacrificial material to expose a capping layer over a gate stack and to expose a sidewall of a gate spacer;
   placing a second photoresist over a second sacrificial material;
   forming a second opening at least partially through the second sacrificial material;
   after stopping the forming the second opening, extending the second opening through the second sacrificial material to expose a source/drain contact; and
   filling the first opening and the second opening with a conductive material.

9. The method of claim 8, wherein the capping layer is in physical contact with the gate stack.

10. The method of claim 8, wherein the capping layer comprises tungsten.

11. The method of claim 8, wherein the forming the second opening exposes a surface of a second portion the first sacrificial material.

12. The method of claim 8, further comprising:
    depositing a source/drain contact material;
    recessing the source/drain contact material from a first region; and
    filling the first region with the second sacrificial material.

13. The method of claim 12, wherein there is a gap height between the second sacrificial material and the first sacrificial material.

14. The method of claim 8, further comprising forming a helmet material over the first sacrificial material prior to the placing the first photoresist.

15. A semiconductor device comprising:
    a gate stack;
    a capping layer over the gate stack;
    a first sacrificial layer over the capping layer;
    a gate contact extending through the first sacrificial layer and in physical contact with the capping layer;
    a first spacer adjacent to and in physical contact with each of the gate stack, the capping layer, and the gate contact;
    a source/drain contact adjacent to the first spacer;
    a second sacrificial layer over the source/drain contact, the second sacrificial layer being different from the first sacrificial layer;
    a source/drain contact plug extending through the second sacrificial layer and in physical contact with the source/drain contact; and
    a helmet material over the first sacrificial layer and the first spacer.

16. The semiconductor device of claim 15, wherein the first sacrificial layer extends over a portion of the first spacer.

17. The semiconductor device of claim 15, wherein the first sacrificial layer is planar with the first spacer.

18. The semiconductor device of claim 15, wherein there is a gap height between the first sacrificial layer and the second sacrificial layer.

19. The semiconductor device of claim 15, wherein the first spacer comprises a first material adjacent to the gate stack and a second material on an opposite side of the first material from the gate stack.

20. The method of claim 14, wherein the helmet material is a first material and the first sacrificial material is the first material.

* * * * *